United States Patent
Sugahara

(10) Patent No.: US 7,608,983 B2
(45) Date of Patent: Oct. 27, 2009

(54) PIEZOELECTRIC ACTUATOR, LIQUID TRANSPORTING APPARATUS, AND LIQUID-DROPLET JETTING APPARATUS

(75) Inventor: Hiroto Sugahara, Aichi-ken (JP)

(73) Assignee: Brother Kogyo Kabushiki Kaisha, Nagoya-Shi (JP)

( * ) Notice: Subject to any disclaimer, the term of this patent is extended or adjusted under 35 U.S.C. 154(b) by 63 days.

(21) Appl. No.: 11/879,110

(22) Filed: Jul. 16, 2007

(65) Prior Publication Data
US 2008/0018204 A1 Jan. 24, 2008

(30) Foreign Application Priority Data
Jul. 18, 2006 (JP) ............... 2006-195041

(51) Int. Cl.
*H01L 41/08* (2006.01)
(52) U.S. Cl. ............... 310/324; 310/330; 310/348
(58) Field of Classification Search ............... 310/324, 310/328, 330, 331, 348
See application file for complete search history.

(56) References Cited

U.S. PATENT DOCUMENTS

| | | | | |
|---|---|---|---|---|
| 4,032,929 A * | 6/1977 | Fischbeck et al. | ............. | 347/42 |
| 4,641,153 A * | 2/1987 | Cruz-Uribe | ................. | 347/68 |
| 6,087,760 A * | 7/2000 | Yamaguchi et al. | .......... | 310/334 |
| 6,336,717 B1 | 1/2002 | Shimada et al. | | |
| 6,502,928 B1 | 1/2003 | Shimada et al. | | |
| 6,584,660 B1 * | 7/2003 | Shimogawa et al. | ........ | 29/25.35 |
| 6,870,445 B2 * | 3/2005 | Kawakubo et al. | .......... | 333/187 |
| 2005/0068377 A1 | 3/2005 | Ishikawa et al. | | |
| 2005/0285911 A1 | 12/2005 | Sugahara | | |
| 2006/0181582 A1 | 8/2006 | Sugahara | | |
| 2006/0262167 A1 | 11/2006 | Sugahara | | |
| 2007/0007859 A1 * | 1/2007 | Weber | ........................ | 310/324 |

FOREIGN PATENT DOCUMENTS

| | | | |
|---|---|---|---|
| JP | 2-187352 A | * | 7/1990 |
| JP | 10034922 | | 2/1998 |
| JP | 11309864 | | 11/1999 |
| JP | 2000211134 | | 8/2000 |
| JP | 2006-321174 | | 11/2006 |

\* cited by examiner

*Primary Examiner*—Thomas M Dougherty
(74) *Attorney, Agent, or Firm*—ReedSmith LLP

(57) ABSTRACT

A piezoelectric actuator includes a piezoelectric layer, a vibration plate, a supporting member which has an relief portion. A thin wall portion is provided in a first area, of one of the piezoelectric layer and vibration plate, facing one end portion in a longitudinal direction of the relief portion. A thickness of the thin wall portion is smaller than a thickness of areas, of one of the piezoelectric layer and vibration plate, facing the central portion and one end portion in a width direction of a pressure chamber, respectively. This makes it possible to provide a piezoelectric actuator which is capable of increasing an amount of displacement of the vibration plate.

25 Claims, 23 Drawing Sheets

PIEZOELECTRIC ACTUATOR, LIQUID TRANSPORTING APPARATUS, AND LIQUID-DROPLET JETTING APPARATUS

CROSS-REFERENCE TO RELATED APPLICATION

The present application claims priority from Japanese Patent Application No. 2006-195041, filed on Jul. 18, 2006, the disclosure of which is incorporated herein by reference in its entirety.

BACKGROUND OF THE INVENTION

1. Field of the Invention

The present invention relates to a piezoelectric actuator, a liquid transporting apparatus which transports a liquid, and a liquid-droplet jetting apparatus which jets liquid droplets.

2. Description of the Related Art

As an actuator, of an ink-jet head for jetting droplets of an ink (ink droplets), which applies a pressure to a liquid (ink) in an ink channel, there has been known a unimorph piezoelectric actuator. Such a piezoelectric actuator, of the ink-jet head, includes a vibration plate which covers pressure chambers forming a part of an ink channel; a piezoelectric layer which is arranged on a surface of the vibration plate to face the pressure chambers; and electrodes which generate an electric field in the piezoelectric layer in a direction of thickness of the piezoelectric layer (thickness direction). When the electric field acts on the piezoelectric layer in the thickness direction, the piezoelectric layer is deformed to thereby generate a bending deformation in the vibration plate at a portion of the vibration plate facing the pressure chambers. This changes volume inside the pressure chambers to apply the jetting pressure to the ink inside the pressure chambers.

Here, for applying a substantial pressure to the ink inside the pressure chambers, it is necessary to substantially increase the change in the volume of the pressure chambers. For this purpose, it is effective to substantially increase an amount of displacement (displacement amount) of each of the piezoelectric layer and the vibration plate at an area facing the pressure chambers. For realizing this, it has been known to lower (reduce) a bending stiffness of such an area by forming a thin wall portion in a part of the vibration plate and the piezoelectric layer. For example, a piezoelectric actuator, described in FIG. 6 of Japanese Patent Application Laid-open No. H11-309864, is provided for a pressure chamber having a parallelogram shape in a plan view. In this piezoelectric actuator, a recess elongated or extending along a long side of the pressure chamber is formed on the inner surface of the vibration plate at an area facing an end in a direction of width of the pressure chamber (width direction; direction orthogonal to the longitudinal direction of the pressure chamber). Consequently, the thickness of the vibration plate is thinned (reduced) locally at the area of the vibration plate in which the recess is formed, and thus the bending stiffness is reduced (lowered) at this area.

For applying even more substantial pressure to the ink inside the pressure chamber by increasing amount of change in the volume of the pressure chamber when the actuator is driven, it is also important to increase, as much as possible, a length in the longitudinal direction of the pressure chamber, of a portion of the vibration plate at which the displacement of the vibration plate becomes the maximum (a portion, of the vibration plate, exerting the maximum pressure to the ink in the pressure chamber). However, in an actuator 500 hitherto know and as shown in FIG. 25, areas (first constrained areas) 505, of each of a vibration plate 501 and a piezoelectric layer 502, are constrained to almost same extent from three surrounding walls surrounding the first constrained areas 505 respectively in three directions, because the first constrained areas 505 are located near ends in the longitudinal direction of a pressure chamber 503 respectively, and are each located at almost a same distance from a wall surface 504a defining the ends in the longitudinal direction of the pressure chamber 503 and from a wall surface 504b defining ends in the width direction of the pressure chamber 503. Therefore, the first constrained areas 505 of the vibration plate 501 and the piezoelectric actuator 502 are not deformed as easily as areas (second constrained areas) 506, of each of the vibration plate 501 and the piezoelectric layer 502, which overlap with the ends the width direction of the pressure chamber 503 and which are constrained from only one direction (one side). Therefore, even when the bending stiffness of the first constrained area 505 of the vibration plate 501 and the piezoelectric layer 502 is same as the bending stiffness of the second constrained area 506 of the vibration plate 501 and the piezoelectric layer 502, the displacement amount of the vibration plate 501 becomes small in the first constrained area 505.

Therefore, even when a recess is formed in a portion of the vibration plate as in the piezoelectric actuator disclosed in Japanese Patent Application Laid-open No. H11-309864, a force of constraint (constraining force) from the surrounding is not changed in the first constrained area, and thus the displacement of the vibration plate is not large at the first constrained area. Therefore, when an attempt is made to change the volume of the pressure chambers more substantially when the actuator is driven to thereby apply a substantial pressure to the ink inside the pressure chambers, it is necessary to increase drive voltage of the actuator. In such a case, the cost of an electric equipment system is consequently increased.

SUMMARY OF THE INVENTION

An object of the present invention is to provide a piezoelectric actuator which is capable of increasing the displacement amount of the vibration plate and/or the piezoelectric layer at the first constrained area of the vibration plate and/or the piezoelectric layer.

According to a first aspect of the present invention, there is provided a piezoelectric actuator which applies a pressure to an object, including:

a vibration plate;

a piezoelectric layer arranged on one surface of the vibration plate;

a supporting member supporting the vibration plate and the piezoelectric layer, the supporting member having a relief portion which is long in a predetermined longitudinal direction and which releases a deformation of the vibration plate and the piezoelectric layer, and a joining portion which is arranged to surround the relief portion and is joined to one of the vibration plate and the piezoelectric layer; and a first electrode and a second electrode which are arranged on both surfaces of the piezoelectric layer respectively, each of the first and second electrodes being arranged at an area facing the relief portion;

wherein a bending-stiffness lowering portion is formed, in one of the vibration plate and the piezoelectric layer, at a first area thereof facing one end (end portion) of the relief portion in the longitudinal direction, the bending-stiffness lowering portion lowering a bending-stiffness, of one of the vibration plate and the piezoelectric layer, at the first area than a bending-stiffness, of one of the vibration plate and the piezoelectric layer, at a second area facing one end of the relief portion in a width direction orthogonal to the longitudinal direction.

When an electric field acts to a portion of the piezoelectric layer sandwiched between the first electrode and the second electrode, this portion of the piezoelectric layer is contracted, thereby causing a bending deformation (warping deformation) in each of the vibration plate and the piezoelectric layer, at the area (first area) facing the relief portion. Here, the deformation of the first area of one of the vibration plate and the piezoelectric layer, which is located near the end in the longitudinal direction of the relief portion, and which faces an area (first constrained area), which is located almost at a same distance from three surrounding joining portions surrounding this area respectively, is constrained by the three surrounding joining portions. Therefore, even when the bending stiffness in the first area is same as that of the second area facing the one end in the width direction of the relief portion, the first area is not deformed as easily as the second area. On the other hand, in the present invention, the bending-stiffness lowering portion which lowers or reduces the bending stiffness of the first area to be lower than the bending stiffness of the second area facing one end in the width direction of the relief portion, is provided on the portion (first area) of one of the vibration plate and the piezoelectric layer, the portion facing the first constrained area near the one end in the longitudinal direction of the relief portion. Therefore, the vibration plate and the piezoelectric layer are easily deformed at this portion facing the first constrained area near the one end in the longitudinal direction. In other words, the displacement of the vibration plate and the piezoelectric layer at the one end in the longitudinal direction of the relief portion approaches the maximum displacement (displacement at the central portion of the pressure chamber), thereby making it possible to obtain a uniformly deformed state over almost entire length of the relief portion.

In the piezoelectric actuator of the present invention, the bending-stiffness lowering portion may include a first bending-stiffness lowering portion and a second bending-stiffness lowering portion; and the first bending-stiffness lowering portion and the second bending-stiffness lowering portion may be provided, on one of the vibration plate and the piezoelectric layer, at the first area facing the one end in the longitudinal direction and a third area facing the other end in the longitudinal direction of the relief portion, respectively. Sine the first bending-stiffness lowering portion and the second bending-stiffness lowering portion are provided on the first and third areas, of one of the vibration plate and the piezoelectric layer, facing both ends in the longitudinal direction of the relief portion respectively, the displacement of the first and third areas of one of the vibration plate and the piezoelectric layer, which faces the both ends in the longitudinal direction of the relief portion respectively, is increased (becomes substantial).

In the piezoelectric actuator of the present invention, the bending-stiffness lowering portion may be a first thin wall portion having a wall thickness smaller than a thickness of a fourth area, of one of the vibration plate and the piezoelectric layer, facing a central portion of the relief portion. By providing, in such a manner, the first thin wall portion on the first area, of one of the vibration plate and the piezoelectric layer, which faces the one end in the longitudinal direction of the relief portion, the bending stiffness of this first area becomes lower than the bending stiffness of the second area facing the one end in the width direction of the relief portion.

In the piezoelectric actuator of the present invention, the first thin wall portion may be a recess formed locally on a surface, of the piezoelectric layer, on a side opposite to the vibration plate, the recess being formed at another area of the piezoelectric layer facing the one end in the longitudinal direction of the relief portion; and the piezoelectric actuator may further include a predetermined wiring portion which is connected to one of the first electrode and the second electrode arranged on a surface, among the both surfaces of the piezoelectric layer, on a side opposite to the vibration plate, and the wiring portion may be arranged avoiding the first thin wall portion. When the first thin wall portion is formed as a recess on the surface, of the piezoelectric layer, on the side opposite to the vibration plate in this manner, there is no possibility that the wiring portion is divided by the recess because the wiring portion, which is to be connected to the electrode positioned on the same surface as the recess of the piezoelectric layer is arranged avoiding the recess.

In the piezoelectric actuator of the present invention, a second thin wall portion having a wall thickness smaller than a thickness of the fourth area of one of the vibration plate and the piezoelectric layer may be formed on the second area of one of the vibration plate and the piezoelectric layer. According to this structure, it is possible to also increase the displacement of the portion of the vibration plate, facing the one end in the width direction of the relief portion.

In the piezoelectric actuator of the present invention, wherein the first thin wall portion may be thinner than the second thin wall portion. According to this structure, the bending stiffness of the first area of one of the vibration plate and the piezoelectric layer, facing the one end in the longitudinal direction of the relief portion in which the first thin wall portion is formed, becomes lower than the bending stiffness of the second area, of one of the vibration plate and the piezoelectric layer, facing the one end in the width direction of the relief portion in which the second thin wall portion is formed.

In the piezoelectric actuator of the present invention, wherein an occupation rate of the first thin wall portion with respect to the first area of one of the vibration plate and the piezoelectric layer may be greater than an occupation rate of the second thin wall portion with respect to the second area of one of the vibration plate and the piezoelectric layer. According to this structure, the bending stiffness of the first area, of one of the vibration plate and the piezoelectric layer, facing the one end in the longitudinal direction of the relief portion in which the first thin wall portion is formed becomes lower than the bending stiffness of the second area, of one of the vibration plate and the piezoelectric layer, facing the one end in the width direction of the relief portion in which the second thin wall portion is formed.

In the piezoelectric actuator of the present invention, the bending-stiffness lowering portion may be a first through hole formed in the first area of one of the vibration plate and the piezoelectric layer. By providing the first through hole in the first area of one of the vibration plate and the piezoelectric layer facing the one end in the longitudinal direction of the relief portion in this manner, the bending stiffness of the first area becomes lower than the bending stiffness of the second area facing the one end in the width direction of the relief portion.

In the piezoelectric actuator of the present invention, a second through hole may be formed in the second area of one of the vibration plate and the piezoelectric layer; and an occupation rate of the first through hole with respect to the first area of one of the vibration plate and the piezoelectric layer may be greater than an occupation rate of the second through hole with respect to the second area of one of the vibration plate and the piezoelectric layer. According to this structure, the bending stiffness of the first area of one of the vibration plate and the piezoelectric layer facing the one end in the longitudinal direction of the relief portion in which the first through hole is formed becomes lower than the bending stiffness of the second area of one of the vibration plate and the piezoelectric layer facing the one end in the width direction of the relief portion in which the second through hole is formed.

In the piezoelectric actuator of the present invention, wherein a thin wall portion, of which thickness is smaller than a thickness of one of the vibration plate and the piezoelectric layer in the fourth area, may be formed in the second area of one of the vibration plate and the piezoelectric layer. According to this structure, the bending stiffness of the first area of one of the vibration plate and the piezoelectric layer, facing the one end in the longitudinal direction of the relief portion in which the first through hole is formed becomes lower than the bending stiffness of the second area of one of the vibration plate and the piezoelectric layer facing the one end in the width direction of the relief portion in which the thin wall portion is formed.

In the piezoelectric actuator of the present invention, the bending-stiffness lowering portion may be a first cavity formed in a portion between the vibration plate and the piezoelectric layer, the portion facing the one end in the longitudinal direction of the relief portion. By providing, in this manner, the first cavity on the portion between the vibration plate and the piezoelectric layer, the portion facing the one end in the longitudinal direction of the relief portion, the bending stiffness of this portion becomes lower than the bending stiffness of the second area facing the one end in the width direction of the relief portion.

In the piezoelectric actuator of the present invention, a second cavity may be formed in another portion between the vibration plate and the piezoelectric layer, the another portion facing the one end in the width direction of the relief portion; and a depth of the first cavity may be greater than a depth of the second cavity. According to this structure, the bending stiffness of the first area of one of the vibration plate and the piezoelectric layer facing the one end in the longitudinal direction of the relief portion in which the first cavity is provided becomes lower than the bending stiffness of the second area of one of the vibration plate and the piezoelectric layer facing the one end in the width direction of the relief portion in which the second cavity is provided.

In the piezoelectric actuator of the present invention, a filling material having an elastic coefficient smaller than an elastic coefficient of each of the vibration plate and the piezoelectric layer may be filled in the first cavity. According to this structure, by filling the filling material in the first cavity formed in the portion between the vibration plate and the piezoelectric layer, the portion facing the one end in the longitudinal direction of the relief portion, the bending stiffness of this portion becomes lower than the bending stiffness of the second area facing the one end in the width direction of the relief portion.

In the piezoelectric actuator of the present invention, the bending-stiffness lowering portion may be formed only at the first area of at least one of the vibration plate and the piezoelectric layer. In this case, since the bending-stiffness lowering portion is formed in the first area, of at least one of the vibration plate and the piezoelectric layer, facing the one end in the longitudinal direction of the relief portion, it is possible to form the low bending portion easily and to increase (make substantial) the deformation of the vibration plate and the piezoelectric layer.

According to a second aspect of the present invention, there is provided a piezoelectric actuator which applies a pressure to an object, including:
  a vibration plate;
  a piezoelectric layer arranged on one surface of the vibration plate;
  a supporting member which supports the vibration plate and the piezoelectric layer, the supporting member having a relief portion which is long in a predetermined longitudinal direction and which releases a deformation of the vibration plate and the piezoelectric layer, and joining portion which is arranged to surround the relief portion and which has a wall facing one end of the relief portion in the longitudinal direction; and
  a first electrode and a second electrode which are arranged on both surfaces of the piezoelectric layer respectively, each of the first and second electrodes being arranged at an area facing the relief portion;
  wherein a bending-stiffness lowering portion, which lowers a bending stiffness of the wall, is formed in the wall of the joining portion.

According to the second aspect of the present invention, the bending-stiffness lowering portion which reduces the bending stiffness of the wall is provided on the wall, of the joining portion joined to one of the vibration plate and the piezoelectric layer, which is in contact with the one end in the longitudinal direction of the relief portion. Therefore, the bending stiffness of the wall is lowered, and the constraining force with respect to an area or a portion, of the vibration plate and the piezoelectric layer, facing the one end in the longitudinal direction of a pressure chamber is weakened, and the vibration plate and the piezoelectric layer become are easily deformed. In other words, the displacement of the vibration plate and the piezoelectric layer at the one end in the longitudinal direction of the relief portion approaches to the maximum displacement (displacement at the central portion of the pressure chamber), and thus a uniformly deformed state is achieved over almost entire length of the relief portion.

In the piezoelectric actuator of the present invention, the bending-stiffness lowering portion may be a groove formed in the wall portion along the one end in the longitudinal direction of the relief portion. In this case, since the groove is formed in the wall portion along the one end in the longitudinal direction of the relief portion, the bending stiffness of this wall is lowered, thereby reducing the constraining force with respect to the vibration plate and the piezoelectric layer.

In the piezoelectric actuator of the present invention, the bending-stiffness lowering portion may be formed only in a portion, of the wall, facing the one end in the longitudinal direction of the relief portion. In this case, since the bending-stiffness lowering portion is formed only in the portion, of the wall, facing the one end in the longitudinal direction of the relief portion, it is possible to form the bending-stiffness lowering portion easily, and to increase the deformation of the vibration plate and the piezoelectric layer.

According to a third aspect of the present invention, there is provided a liquid transporting apparatus which transports a liquid, including:
  a channel unit having a liquid channel formed therein, the liquid channel including a pressure chamber which is long in a predetermined longitudinal direction; and
  a piezoelectric actuator which applies a pressure to the liquid in the pressure chamber, the piezoelectric actuator including a vibration plate covering the pressure chamber; a piezoelectric layer arranged on one surface of the vibration plate; and a first electrode and a second electrode which are arranged on both surfaces of the piezoelectric layer respectively, each of the first and second electrodes being arranged at an area facing the pressure chamber;

wherein a bending-stiffness lowering portion is formed, in one of the vibration plate and the piezoelectric layer, at a first area thereof facing one end of the pressure chamber in the longitudinal direction, the bending-stiffness lowering portion lowering a bending-stiffness, of one of the vibration plate and the piezoelectric layer, at the first area than a bending-stiffness, of one of the vibration plate and the piezoelectric layer, at a second area facing one end of the pressure chamber in a width direction orthogonal to the longitudinal direction.

According to the third aspect of the present invention, since the bending-stiffness lowering portion, which reduces the bending stiffness of the first area facing the one end in the longitudinal direction of the pressure chamber to be lower than that of the second area facing the one end in the width direction of the pressure chamber, is provided on the first area of one of the vibration plate and the piezoelectric layer, the vibration plate and the piezoelectric layer are easily deformed at the first area facing the one end in the longitudinal direction of the pressure chamber. Consequently, the displacement of the vibration plate and/or the piezoelectric layer at the one end in the longitudinal direction of the pressure chamber approaches to the maximum displacement (displacement at the central portion of the pressure chamber), thereby achieving a uniformly deformed state is achieved over almost entire length of the pressure chamber. Accordingly, there is an increase in an amount of change in the volume of the pressure chamber when the actuator is driven, thereby making it possible to apply a substantial pressure to the liquid in the pressure chamber.

In the liquid transporting apparatus of the present invention, the bending-stiffness lowering portion may be formed only in the first area, of at least one of the vibration plate and the piezoelectric layer, facing the one end in the longitudinal direction of the pressure chamber. In this case, since the bending-stiffness lowering portion is formed only in the first area, of at least one of the vibration plate and the piezoelectric layer, facing the one end in the longitudinal direction of the pressure chamber, it is possible to form the bending-stiffness lowering portion easily and to increase the deformation of the vibration plate and the piezoelectric layer.

According to a fourth aspect of the present invention, there is provided a liquid-droplet jetting apparatus which jets a droplet of a liquid, including:

a channel unit having a nozzle and a liquid channel formed therein, the liquid channel including a pressure chamber which is long in a predetermined direction and which communicates with the nozzle; and a piezoelectric actuator which applies a pressure to the liquid in the pressure chamber, the piezoelectric actuator including a vibration plate covering the pressure chamber; a piezoelectric layer arranged on one surface of the vibration plate; and a first electrode and a second electrode which are arranged on both surfaces of the piezoelectric layer, respectively, each of the first and second electrodes being arranged at an area facing the pressure chamber;

wherein a bending-stiffness lowering portion is formed, in one of the vibration plate and the piezoelectric layer, at a first area thereof facing one end of the pressure chamber in the longitudinal direction, the bending-stiffness lowering portion lowering a bending-stiffness, of one of the vibration plate and the piezoelectric layer, at the first area than a bending-stiffness, of one of the vibration plate and the piezoelectric layer, at a second area facing one end of the pressure chamber in a width direction orthogonal to the longitudinal direction.

According to the fourth aspect of the present invention, the bending-stiffness lowering portion, which reduces the bending stiffness of the first area of one of the vibration plate and the piezoelectric layer facing the one end in the longitudinal direction of the pressure chamber to be lower than the bending stiffness of the second area, of one of the vibration plate and the piezoelectric layer, facing the one end in the width direction of the pressure chamber, is provided on the first area of one of the vibration plate and the piezoelectric layer. Accordingly, the vibration plate and the piezoelectric layer are easily deformed at the first area facing the one end in the longitudinal direction. Consequently, the displacement of the vibration plate and the piezoelectric layer at the one end in the longitudinal direction of the pressure chamber approaches to the maximum displacement (displacement at the central portion of the pressure chamber), which in turns achieves a uniformly deformed state over almost entire length of the pressure chamber, thereby increasing an amount of the change in the volume of the pressure chamber when the actuator is driven, applying a substantial pressure to the liquid in the pressure chamber.

In the liquid-droplet jetting apparatus of the present invention, the one end in the longitudinal direction of the pressure chamber may communicate with the nozzle. In this case, since the bending-stiffness lowering portion is formed in the first area facing the one end communicating with the nozzle, it is possible to efficiently apply the jetting pressure to the liquid in the nozzle.

In the liquid-droplet jetting apparatus of the present invention, the bending-stiffness lowering portion may be formed only at the one end, of at least one of the vibration plate and the piezoelectric layer, in the longitudinal direction of the pressure chamber, the one end being on a side of the nozzle.

According to such a construction, the vibration plate and the piezoelectric layer are easily deformed at the first area of at least one of the vibration plate and the piezoelectric layer facing the one end in the longitudinal direction of the pressure chamber, the one end being on the side of the nozzle. Consequently, the displacement of at least one of the vibration plate and the piezoelectric layer, at the one end in the longitudinal direction of the pressure chamber which is on the side of the nozzle, approaches to the maximum displacement (displacement at the central portion of the pressure chamber). Therefore, it is possible to jet the liquid droplets from the nozzle satisfactorily.

DETAILED DESCRIPTION OF THE PREFERRED EMBODIMENTS

An embodiment of the present invention will be described below. This embodiment is an example in which the present invention is applied to an ink-jet head (liquid transporting apparatus and liquid-droplet jetting apparatus) which records a desired image by transporting an ink to a nozzle by applying a pressure to the ink, and jetting liquid droplets of the ink on to a recording paper from this nozzle. In this patent application, a term 'image' also includes characters.

Figure 1:
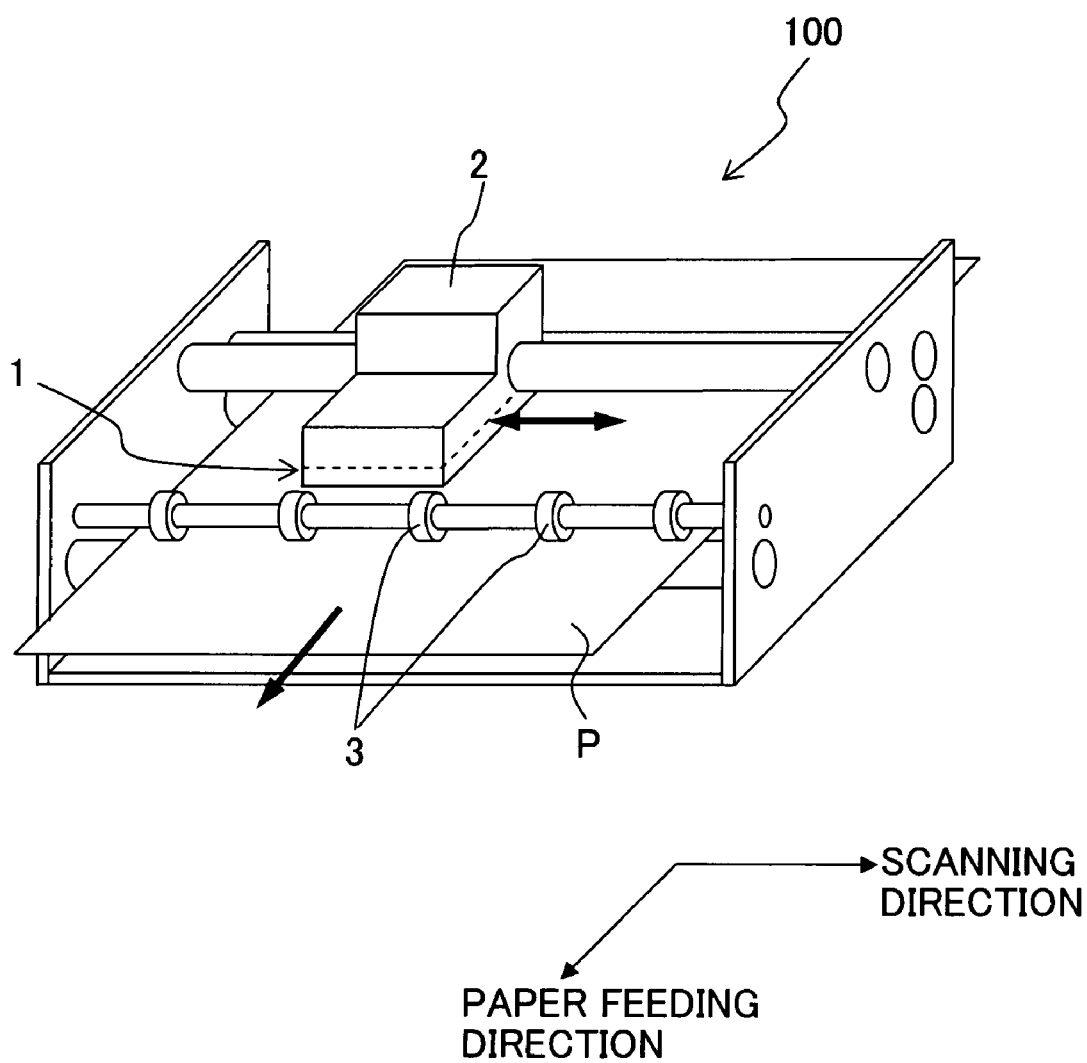
FIG. 1 is a schematic structural diagram of an ink-jet printer according to an embodiment of the present invention.

Firstly, an ink-jet printer which includes an ink-jet head of this embodiment will be described below. As shown in FIG. 1, an ink-jet printer 100 includes mainly, a carriage 2 which is movable in a left and right direction in FIG. 1, an ink-jet head 1 of serial type which is provided on the carriage 2 to jet the ink on to a recording paper P, and transporting rollers 3 which transport the recording paper P in a forward direction in FIG. 1. The ink-jet head 1 moves integrally with the carriage 2 in the left and right direction (scanning direction), and records a desired image by jetting the ink on to the recording paper P from nozzles 20 (refer to FIGS. 2 to 5) arranged in a lower surface of the ink-jet head 1. Moreover, the recording paper P with an image recorded thereon by the ink-jet head 1, is discharged forward (paper feeding direction) by the transporting rollers 3.

Next, the ink-jet head 1 will be described below. As shown in FIGS. 2 to 5, the ink-jet head 1 includes a channel unit 4 in which ink channels including the nozzles 20 and pressure chambers 14 are formed, and a piezoelectric actuator 5 which applies a jetting pressure to the ink in the pressure chamber 14.

Figure 4:
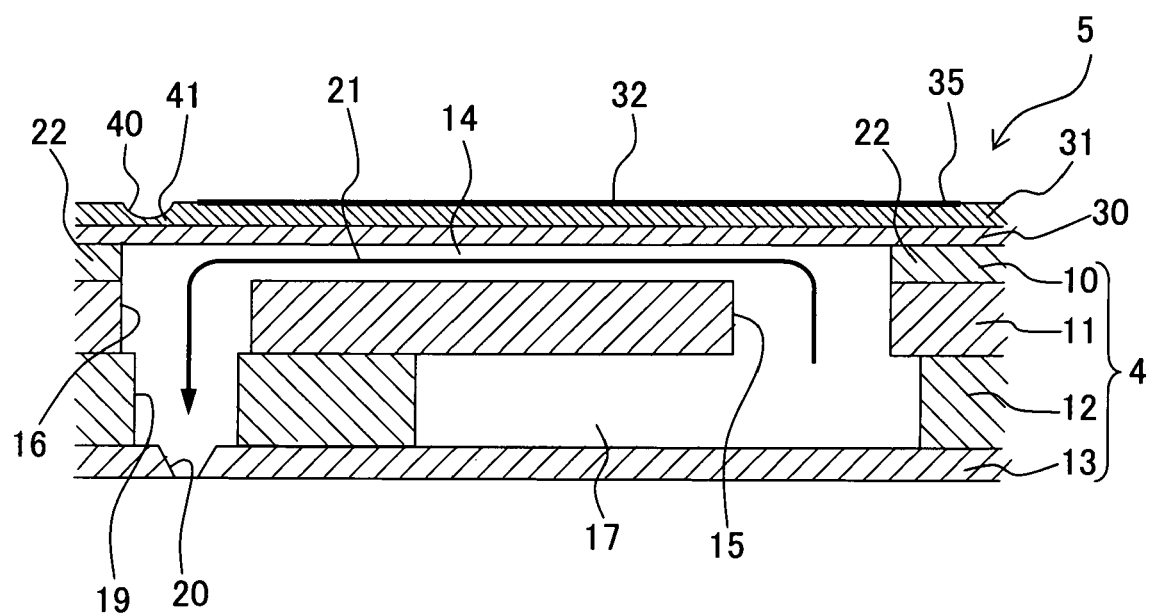
FIG. 4 is a cross-sectional view taken along a line IV-IV in FIG. 3.
Figure 5:
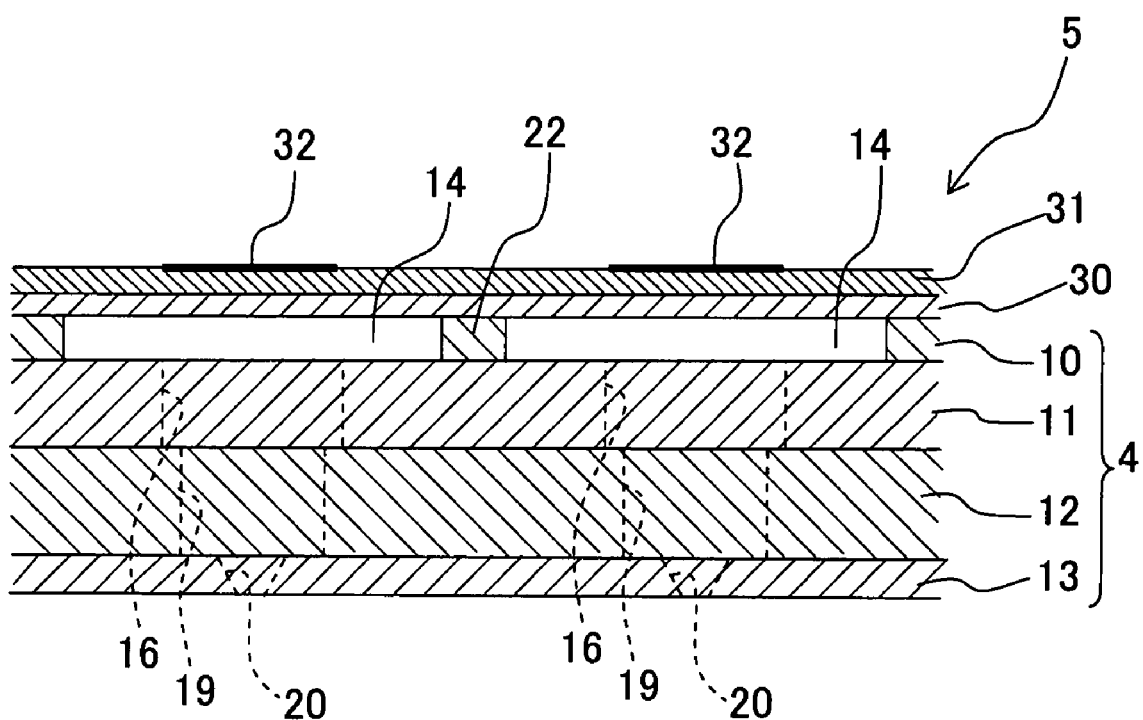
FIG. 5 is a cross-sectional view taken along a line V-V in FIG. 3.

Firstly, the channel unit 4 will be described below. As shown in FIGS. 4 and 5, the channel unit 4 includes a cavity plate 10, a base plate 11, a manifold plate 12, and a nozzle plate 13, and these four plates 10 to 13 are joined in a stacked form. Since the cavity plate 10, the base plate 11, and the manifold plate 12 are stainless steel plates, it is possible to form easily ink channels such as the pressure chambers 14 and a manifold 17 which will be described later, in these three plates 10 to 12 by a method called etching. Moreover, the nozzle plate 13 is formed of a high-molecular synthetic resin material such as polyimide, and is joined (stuck) to a lower surface of the manifold plate 12. The nozzle plate 13 may also be formed of a metallic material such as stainless steel, similar to the three plates 10 to 12.

As shown in FIGS. 2 to 5, in the cavity plate 10 which is at an uppermost position in the four plates 10 to 13, a partition wall 22 which defines a plurality of through holes is formed by forming the through holes arranged along a direction of plane in the cavity plate 10. Moreover, a plurality of pressure chambers 14 defined by the partition wall 22, the vibration plate 30, and the base plate 11 is formed by each of the through holes being covered from both an upper and a lower side, by the base plate 11 and the vibration plate 30 which will be described later. Here, the pressure chambers 14 are arranged in two rows in the paper feeding direction (vertical direction in FIG. 2). Furthermore, a shape of each of the pressure chambers 14 is substantially elliptical, and each of the pressure chambers 14 is elongated in the scanning direction (left and right direction in FIG. 2) in a plan view. The cavity plate 10 forms a part of the channel unit 4, and further, is joined to the vibration plate 30 of the piezoelectric actuator 5 which will be described later, thus also serving as a supporting member which supports the vibration plate 30 from a lower side. This will be described in detail in the description of the piezoelectric actuator 5.

Figure 3:
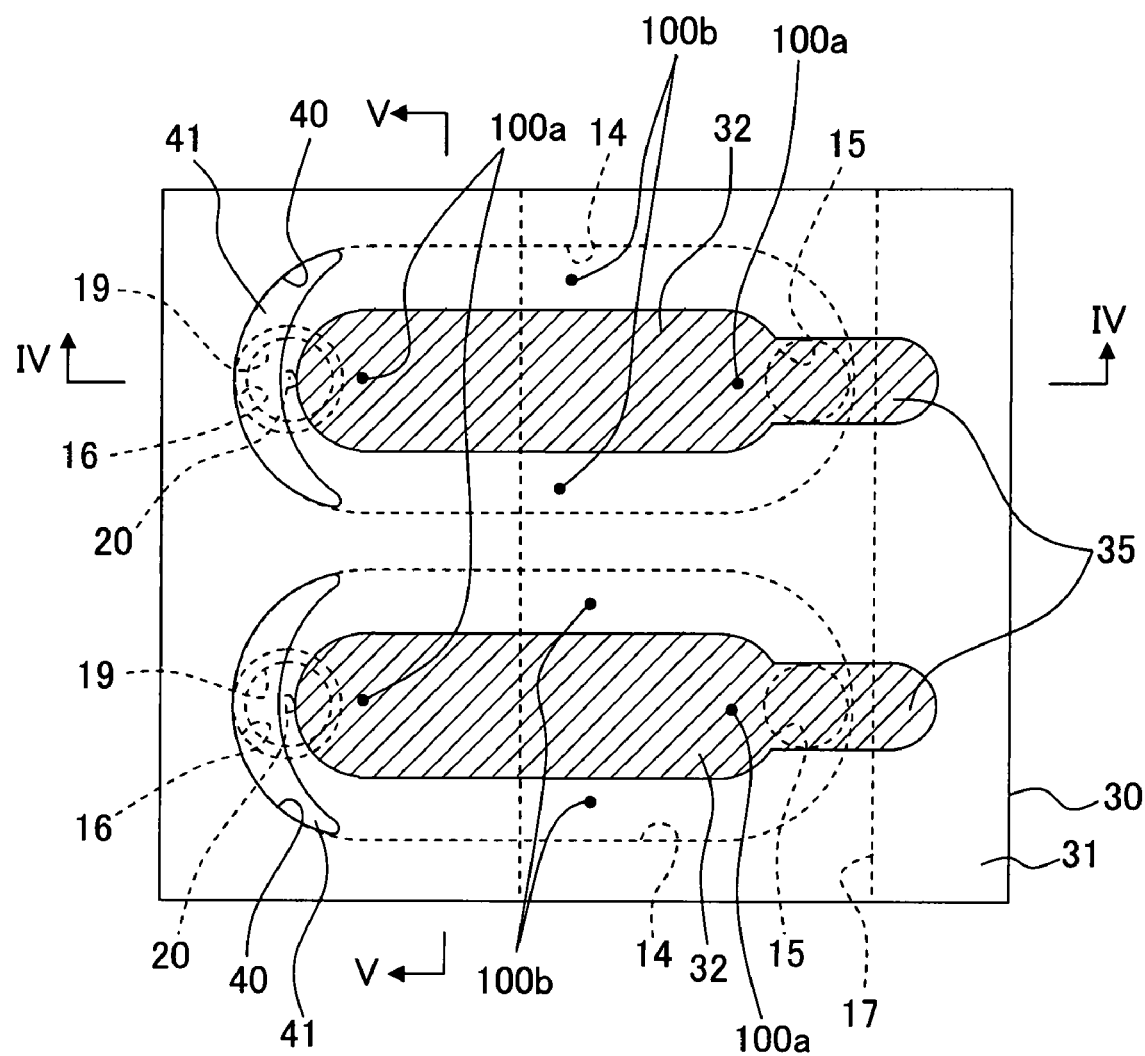
FIG. 3 is a partially enlarged plan view of the ink-jet head in FIG. 2.

As shown in FIG. 3, communicating holes 15 and 16 are formed in the base plate 11 at positions overlapping both end portions of the pressure chamber 14 in a plan view. Moreover, two manifolds 17 extended in the paper feeding direction are formed in the manifold plate 12 such that the manifolds 17 overlap in a plan view with a part toward the communicating hole 15, of the pressure chambers 14 arranged in two rows. These two manifolds 17 communicate with an ink supply port 18 formed in the vibration plate 30 which will be described later, and the ink is supplied from an ink tank which is not shown in the diagram to the manifolds 17 via the ink supply port 18. Furthermore, a plurality of communicating holes 19 which communicate with the plurality of communicating holes 16 is formed in the manifold plate 12, at positions overlapping in a plan view with an end portion of the pressure chambers 14, on a side opposite to the manifold 17.

Figure 2:
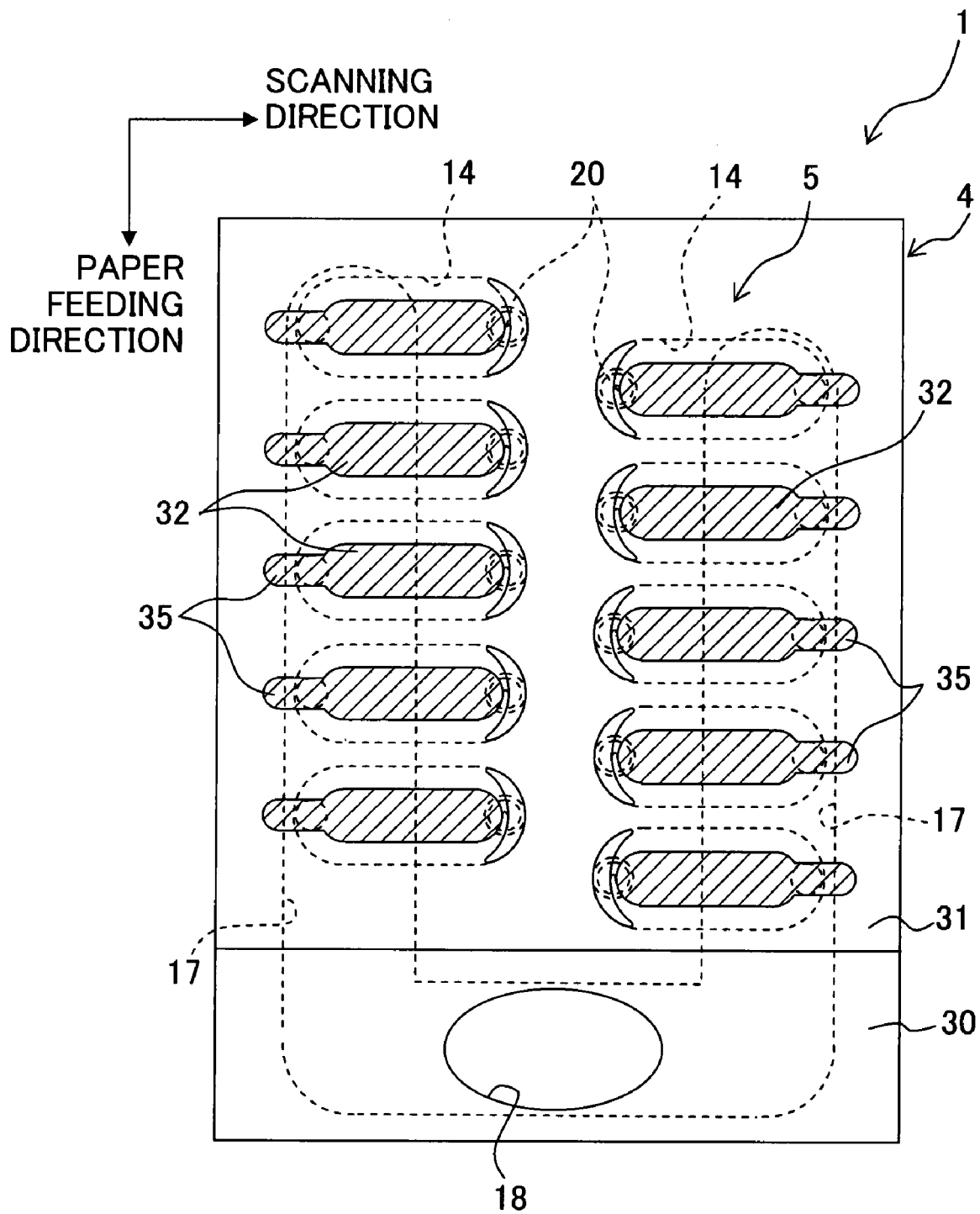
FIG. 2 is a plan view of an ink-jet head.

Furthermore, two rows of nozzles (nozzle rows) are formed in the nozzle plate 13. The plurality of nozzles 20 in each nozzle row are formed in the nozzle plate 13, at positions overlapping with the communicating holes 19 in a plan view. In other words, as shown in FIG. 2, the nozzles 20 are arranged such that each nozzle 20 overlaps with an end portion of (each of) the pressure chambers 14 arranged in two rows along the paper feeding direction, on a side opposite to the manifold 17.

As shown in FIG. 4, the manifold 17 communicates with the pressure chambers 14 via the communicating holes 15, and further, each of the pressure chambers 14 communicates with one of the nozzles 20 via one of the communicating holes 16 and 19. In this manner, a plurality of individual ink channels 21 from the manifold 17 reaching up to the nozzles 20 via the pressure chambers 14, are formed in the channel unit 4.

Next, the piezoelectric actuator 5 will be described below. As shown in FIGS. 2 to 5, the piezoelectric actuator 5 is a plate forming a part of the channel unit 4, and includes the cavity plate 10 (supporting member) described above, the vibration plate 30, a piezoelectric layer 31, and a plurality of individual electrodes 32 (first electrodes). The cavity plate 10 (supporting member) has the pressure chambers 14 (relief portions) formed therein, and forms a part of the channel unit 4. The vibration plate 30 is formed on an upper surface of the cavity plate 10. The piezoelectric layer 31 is formed continuously on an upper surface of the vibration plate 30, covering the pressure chambers 14. The individual electrodes 32 (first electrodes) are formed on an upper surface of the piezoelectric layer 31.

The vibration plate 30 is metallic plate having a substantially rectangular shape in a plan view, and is made of a metallic material such as an iron alloy like stainless steel, a cooper alloy, a nickel alloy, or a titanium alloy. The vibration plate 30 is arranged on the upper surface of the cavity plate 10, covering the pressure chambers 14, and is joined to the partition wall 22 (joining portion) which surrounds the pressure chambers 14. Moreover, the upper surface of the vibration plate 30 which is electroconductive, also serves as a common electrode (second electrode) which generates an electric field in a direction of thickness of the piezoelectric layer 31, sandwiching the piezoelectric layer 31 between the vibration plate 30 and the individual electrodes 32. Furthermore, the vibration plate 30 serving as the common electrode is kept at a ground electric potential all the time.

The piezoelectric layer 31 made of a piezoelectric material, composed of mainly lead zirconate titanate (PZT) which is a solid solution of lead titanate and lead zirconate, and is a ferroelectric substance is formed on the upper surface of the vibration plate 30. The piezoelectric layer 31 is formed continuously, covering the pressure chambers 14. Moreover, it is possible to form the piezoelectric layer 31 by a method such as a chemical vapor deposition (CVD), a sputtering method, and an aerosol deposition method (AD method) in which, particles are deposited by blowing on a substrate an aerosol which includes very fine particles and a carrier gas. Or it is also possible to form the piezoelectric layer 31 by sticking on the vibration plate 30 a piezoelectric sheet which is obtained by baking a green sheet of PZT.

As shown in FIGS. 2 and 3, on the upper surface of the piezoelectric layer 31, in a portion (first area) facing one end portion in the longitudinal direction of the pressure chamber 14 (end portion toward the nozzle 20), a recess 40 having a crescent shape in a plan view, and dented locally is formed. The recess 40 is formed along an edge of the pressure chamber 14, such that the recess 40 does not overlap with the individual electrode 32. In other words, a thin wall portion 41 (first thin wall portion) having a wall thickness less than a central portion or an end portion in a width direction of the piezoelectric layer 31, is provided on a portion of the piezoelectric layer 31, facing the end portion of the pressure chamber 14 toward the nozzle 20. The thin wall portion 41 will be described later in detail.

A plurality of individual electrodes 32 having a substantially elliptical flat shape slightly smaller than the pressure chamber 14 is formed on the upper surface of the piezoelectric layer 31. These individual electrodes 32 are arranged at positions facing the central portion of the corresponding pressure chambers 14. Moreover, the individual electrodes 32 are made of an electroconductive material such as gold, copper, silver, palladium, platinum, or titanium.

A plurality of wiring portions 35 is drawn from end portions of the individual electrodes 32 arranged in two rows, toward the communicating holes 15 (outer side in left and right direction in FIG. 2). It is possible to form the individual electrodes 32 and the wiring portions 35 by a method such as a screen printing and the sputtering method. Moreover, contact points of a flexible wiring member such as a flexible printed circuit (FPC) which is not shown in the diagram are joined to the end portions of the wiring portions 35. The individual electrodes 32 are electrically connected to a driver IC (omitted in the diagram) via the wiring members and the wiring portions 35. At a time of driving of the piezoelectric actuator 5, a predetermined drive voltage is applied to the individual electrode 32 corresponding to the desired nozzle 20 from which the ink is to be jetted.

Figure 6:
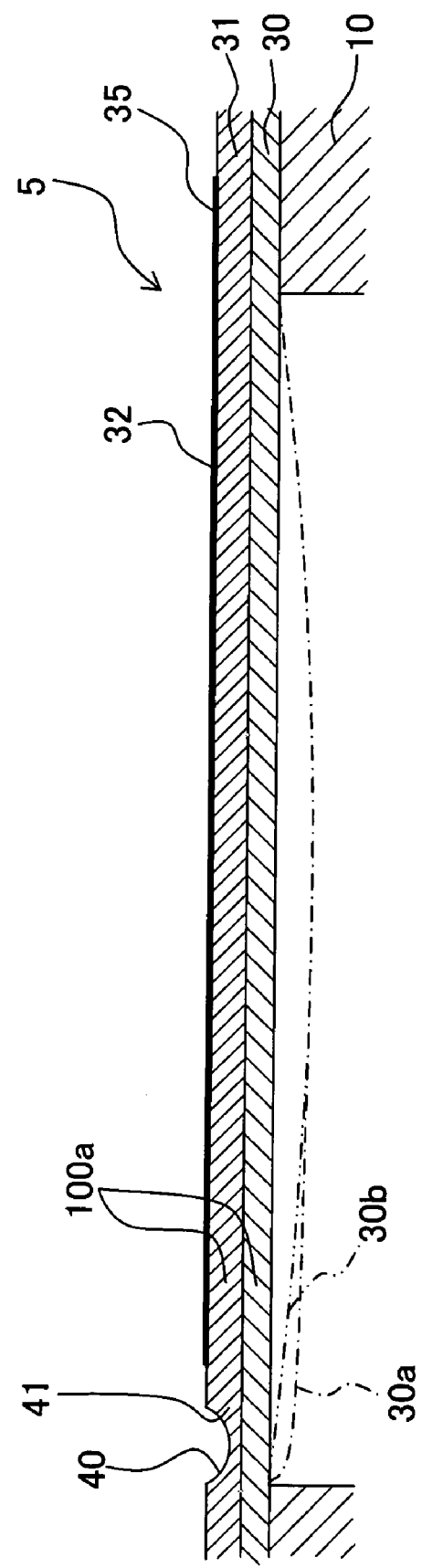
FIG. 6 is a diagram showing schematically a deformed state of a vibration plate at a time of an actuator driving.

Next, an action of the piezoelectric actuator 5 at the time of jetting the ink will be described below. When the drive voltage is applied selectively from the driver IC to the individual electrodes 32, an electric potential difference is generated between the individual electrode 32 on an upper side of the piezoelectric layer 31 to which the drive voltage is applied, and the vibration plate 30 serving as the common electrode on a lower side of the piezoelectric layer 31 which is kept at the ground electric potential. Accordingly, an electric field in a direction of thickness is generated in the piezoelectric layer 31 sandwiched between the individual electrode 32 and the vibration plate 30. Moreover, when the direction of the electric field and the direction in which the piezoelectric layer 31 is polarized are the same, the piezoelectric layer 31 is extended in the direction of thickness which is the direction in which the piezoelectric layer 31 is polarized, and the piezoelectric layer 31 is contracted in a horizontal direction. As shown in FIG. 6, with the contraction deformation (shrinkage deformation) of the piezoelectric layer 31, a portion of the vibration plate 30 facing the pressure chamber 14 is deformed to project toward the pressure chamber 14. At this time, since a volume of the pressure chamber 14 is decreased, a pressure is applied to the ink inside the pressure chamber 14, and droplets of ink are jetted from the nozzle 20 which communicates with the pressure chamber 14.

Here, for applying a substantial pressure to the ink in the pressure chamber 14, by changing substantially the volume of the pressure chamber 14, it is preferable to deform as much as possible the portion of the vibration plate 30 facing the pressure chamber 14. Here, when an area (driving area) of the piezoelectric layer, facing the individual electrode 32 is deformed, with this deformation, a bending moment acts on an area (driven area) facing a surrounding portion of the pressure chamber 14, which is positioned around the driving area. When the bending moment has acted on the driven area, it is effective to reduce (lower) as much as possible a bending stiffness (flexural rigidity, bending rigidity) of the driven area within a range in which a minimum strength is secured, in order that the driven area is deformed as much as possible.

The bending stiffness is a value which indicates a toughness (stiffness) of a member when the bending moment has acted upon, and is expressed by a product (EI) of a coefficient of elasticity E of the member, and a geometrical moment of inertia (cross-sectional moment of inertia) I around a neutral axis. Furthermore, the geometrical moment of inertial I is proportional to a cube of a thickness of member. Consequently, thinner the piezoelectric layer 31, lower is the bending stiffness EI.

Figure 25:
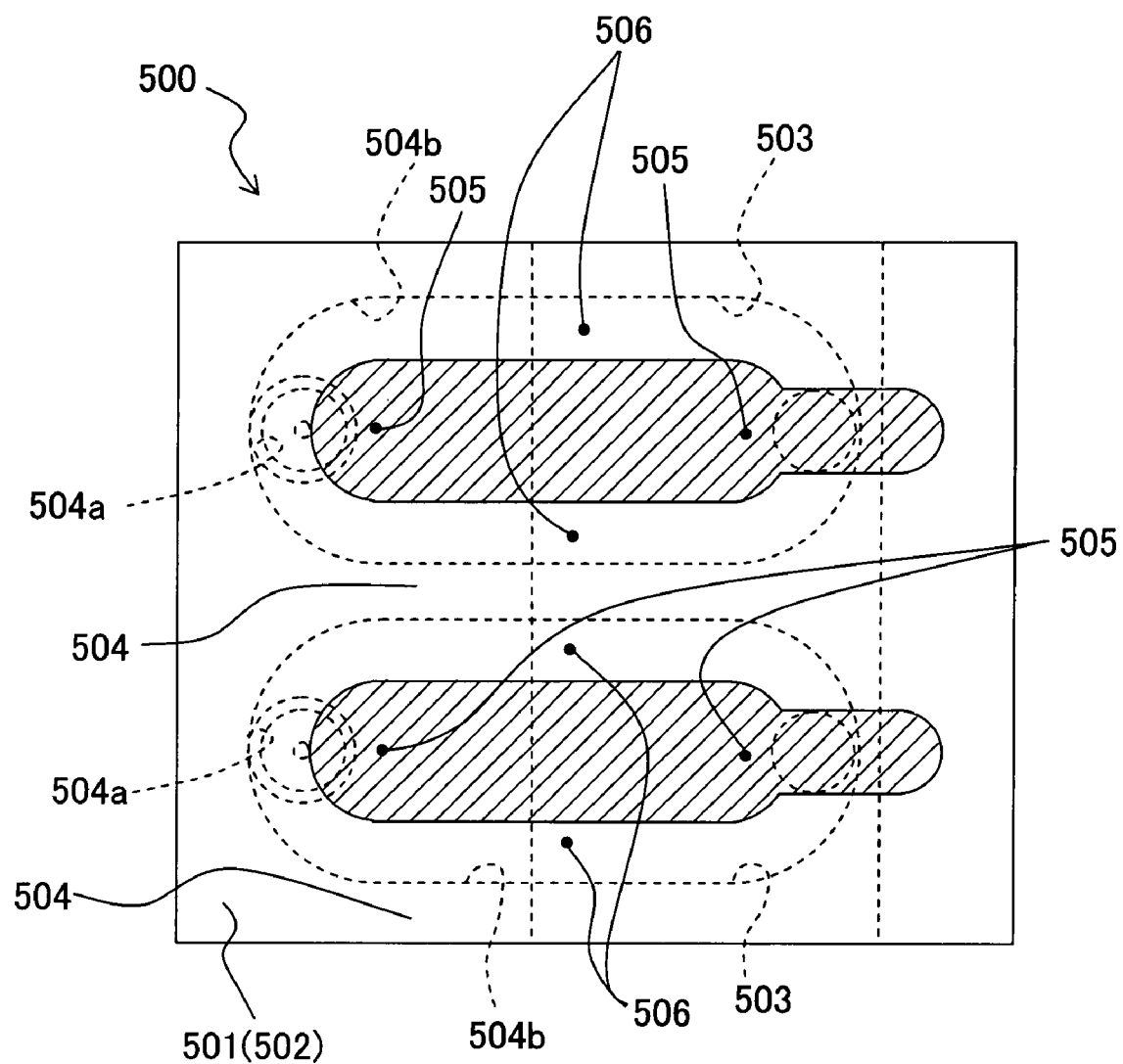
FIG. 25 is a partially enlarged plan view of an ink-jet head.

Here, as it has been described above, in a hitherto known piezoelectric actuator 500 shown in FIG. 25, an area (first constrained area) 505 of a vibration plate 501 and a piezoelectric actuator 502 is constrained to almost same extent from each of surrounding walls in three direction, because the first constrained area is near an end portion in a longitudinal direction of a pressure chamber 503, and is at almost a same distance from a wall surface 504a which defines an end portion in the longitudinal direction of the pressure chamber 503, and a wall surface 504b which defines an end portion in a width direction of the pressure chamber 503. Therefore, when a bending stiffness of the first constrained area 505 of the vibration plate 30 and the piezoelectric layer 31 is same as a bending stiffness of a portion (second constrained area) 506 of the vibration plate 30 and the piezoelectric layer 31, facing the end portion in the width direction of the pressure chamber, the first constrained area 505 is not deformed as easily as the second constrained area 506. Therefore, in the piezoelectric actuator 5 of this embodiment, as shown in FIGS. 2 to 4, out of the driven area of the piezoelectric layer 31, particularly, in area (first area) facing a first constrained area 100a, near one end portion in the longitudinal direction of the pressure chamber 14 (end portion toward the nozzle 20), a recess 40 which is dented locally is formed in the form of a crescent (bow shaped) is formed avoiding the individual electrode 32, along the periphery of the pressure chamber 14. In other words, the recess 40 surrounds the first constrained area 100a of the piezoelectric layer 31. Moreover, by forming the recess 40, the thin wall portion 41 (low stiffness portion) is formed, which is thinner than the area facing a central portion of the pressure chamber 14, and an area (second constrained area, second area) 100b facing an end in a width direction of the pressure chamber 14. It is possible to form the recess 40 easily by a hitherto known method such as laser processing (laser machining). In this manner, since the thin wall portion 41 (recess 40) is formed in the piezoelectric layer 31, the bending stiffness of the area of the piezoelectric layer 31 in which the thin wall portion 41 is positioned, facing the one end portion in the longitudinal direction is lower than the bending stiffness of the area facing the central portion of the pressure chamber 14, and the second constrained area.

In FIG. 6, a displacement 30a of the vibration plate 30 in the piezoelectric actuator 5 of this embodiment is shown by an alternate long and short dashes line, and a displacement 30b of the vibration plate 30 when the thin wall portion 41 (recess 40) is not provided is shown by an alternate long and two short dashes line. As shown in FIG. 6, the vibration plate 30 and the piezoelectric layer 31 are susceptible to be deformed even in the first constrained area 100a, near the end portion in the longitudinal direction of the pressure chamber 14, which is constrained from each of surrounding walls in three direction, and the displacement of the vibration plate 30 at the first constrained area nears the maximum displacement (displacement in the central portion of the pressure chamber 14), and a uniform deformation (condition) is achieved throughout almost the entire length of the pressure chamber 14. As a result, since an amount of deformation of the entire vibration plate 30 is increased (becomes substantial), an amount of change in the volume of the pressure chamber 14 is increased, and even more substantial pressure is applied to the ink in the pressure chamber 14.

Moreover, it is effective to decrease a time (AL value: Acoustic Length) for which a pressure wave generated in the pressure chamber 14 is propagated one way in one individual ink channel 21 (refer to FIG. 4), from a lower end of the communicating hole 15 communicating with the manifold 17, up to the nozzle 20, in order to jet a large number of liquid droplets in a short time by driving the ink-jet head 1 at as much high frequency as possible for increasing a recording speed. Moreover, as a method for decreasing the AL value, it is considered to decrease a length of the pressure chamber 14, in other words, it is considered to shorten a length of the individual ink channel 21. However, in an ink-jet head having a conventional structure, there has been a problem as described below. Since the vibration plate 30 and the piezoelectric layer 31 are hardly deformed at the first constrained area 100a, when the length of the pressure chamber 14 is decreased, sufficient change in the volume of the pressure chamber 14 cannot be achieved. Therefore, it is not possible to apply a pressure, to the ink in the pressure chamber 14, necessary for jetting the liquid droplets at a predetermined jetting speed from the nozzle 20.

On the other hand, in the ink-jet head 1 of the embodiment, the thin wall portion 41 is formed in a portion of the piezoelectric layer 31, facing one end portion in the longitudinal direction of the pressure chamber 14, and the bending stiffness of the piezoelectric layer 31 at a portion facing one end portion in the longitudinal direction of the pressure chamber 14 is lowered, and the piezoelectric layer 31 in this portion is susceptible to be deformed. Therefore, even when a length of the pressure chamber 14 is decreased, since the vibration plate 30 deforms substantially, the volume of the pressure chamber 14 changes substantially. In other words, even when the AL value is decreased by shortening the length of the pressure chamber 14 for the high-speed drive, it is possible to secure the amount of change in the volume of the pressure chamber 14, which is necessary for jetting the liquid droplets from the nozzle 20. Furthermore, since it is possible to reduce a size of the pressure chamber 14 by decreasing the length of the pressure chamber 14, it is possible to reduce further the size of the ink-jet head 1.

The thin wall portion 41 of the piezoelectric layer 31 is provided in an area facing an end portion communicating with the nozzle 20, out of the two end portions in the longitudinal direction of the pressure chamber 14. In this structure, since the deformation of the vibration plate 30 and the piezoelectric layer 31 at the end portion of the pressure chamber 14 communicating with the nozzle 20 becomes substantial, it is possible to apply the jetting pressure efficiently to the ink in the nozzle 20.

Next, modified embodiments in which various modifications are made in the embodiment will be described below. Same reference numerals are assigned to components having a similar structure as in the embodiment, and the description of such components is omitted.

First Modification

Figure 7:
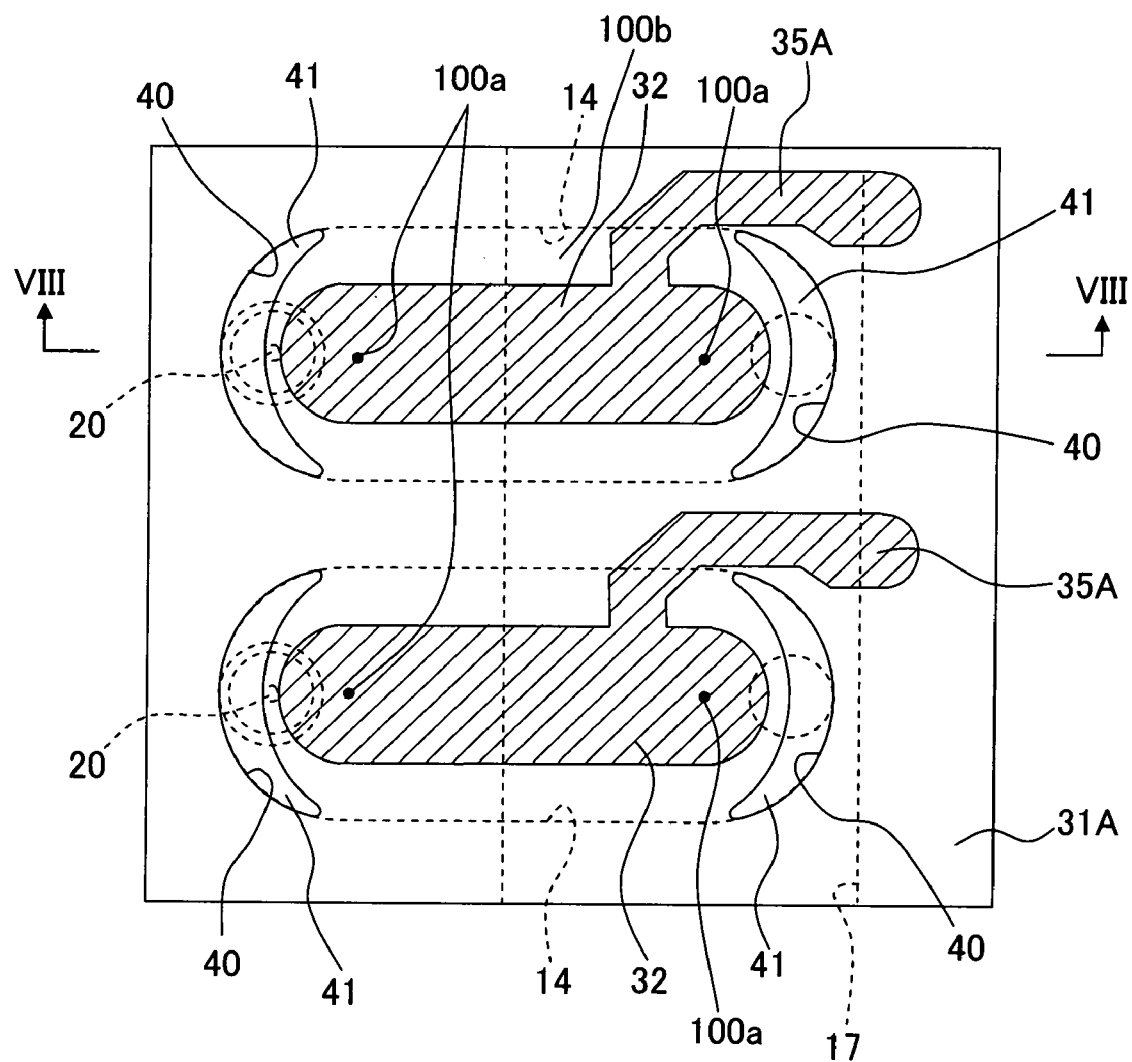
FIG. 7 is a partially enlarged plan view of an ink-jet head according to a first modified embodiment.
Figure 8:
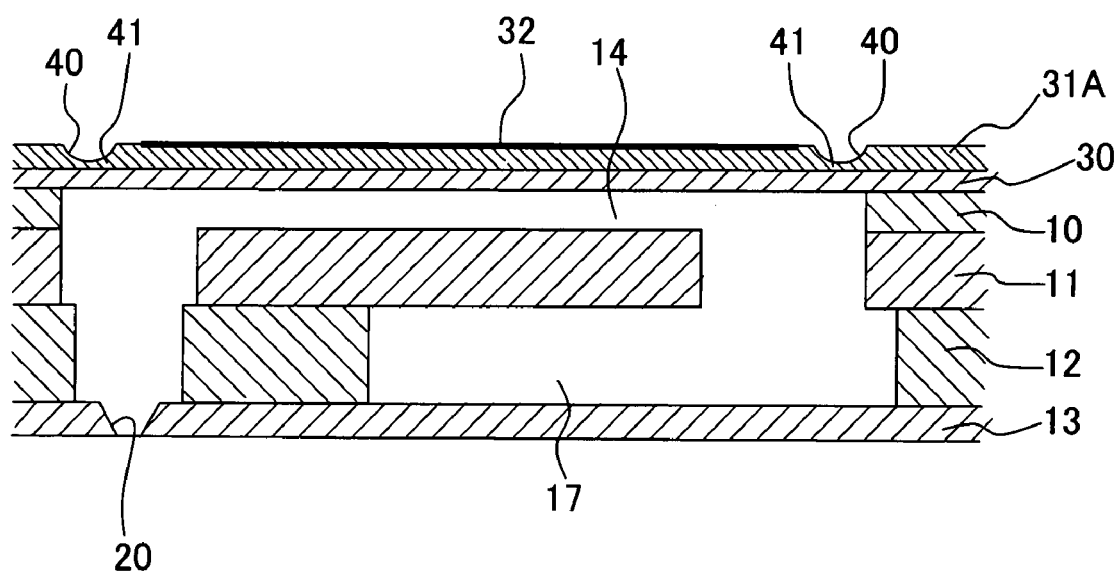
FIG. 8 is a cross-sectional view taken along a line VIII-VIII in FIG. 7.

As shown in FIGS. 7 and 8, the thin wall portions 41 may be formed in each of two areas of a piezoelectric layer 31A, facing the both end portions in the longitudinal direction of the pressure chamber 14. In this structure, the displacement of each of the portions facing the both ends in the longitudinal direction of the pressure chamber 14 increases (becomes substantial), and as in the embodiment, as compared to a case in which the thin wall portion 41 is formed on a portion of the piezoelectric layer 31, facing the end portion toward the nozzle 20 in the longitudinal direction of the pressure chamber 14, the amount of change in the volume of the pressure chamber 14 is further increased. However, as shown in FIG. 7, when a recess 40 which is locally dented is formed on the upper surface of the piezoelectric layer 31, and the thin wall portion 41 is formed by this recess 40, it is preferable to arrange a wiring portion 35A avoiding the thin wall portion 41 (recess 40) of the end portion in the longitudinal direction, by drawing the wiring portion from the individual electrode 32 toward an outside in a width direction of the pressure chamber 14, such that the wiring portion formed by a method such as a screen printing is not divided in the recess 40.

Second Modification

In the embodiment and the first modification, the thin wall portion 41 (refer to FIGS. 2 to 4) for reducing (lowering) the bending stiffness is formed on the piezoelectric layer 31. However, the thin wall portion may be formed on the vibration plate 30.

Figure 9:
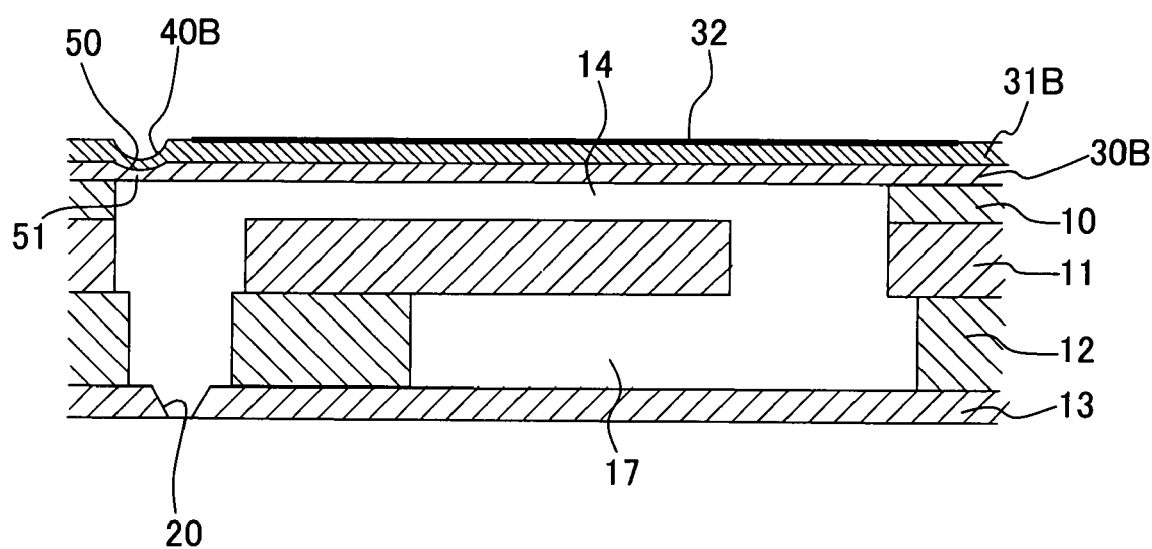
FIG. 9 is a cross-sectional view corresponding to FIG. 4, of an ink-jet head according to a second modified embodiment.

As shown in FIG. 9, a thin wall portion 51 may be a recess 50 which is dented locally, in an area on an upper surface (surface on an opposite side of the pressure chamber 14) of a vibration plate 30B, the area facing the end portion, toward the nozzle 20, of the pressure chamber 14. As shown in FIG. 9, a recess 40B may be formed in a piezoelectric layer 31B, at a position corresponding to the recess 50. Furthermore, when the piezoelectric layer 31 is to be formed by depositing particles of a piezoelectric material on the upper surface of the vibration plate 30, it is possible to make a thickness of the piezoelectric material to be deposited on an inner surface of the recess 50 of the vibration plate 30, to be less than a thickness at a flat surface of the vibration plate 30. As a result, it is possible to form a thin wall portion not only on the vibration plate 30, but also on the piezoelectric layer 31.

Third Modification

Figure 10:
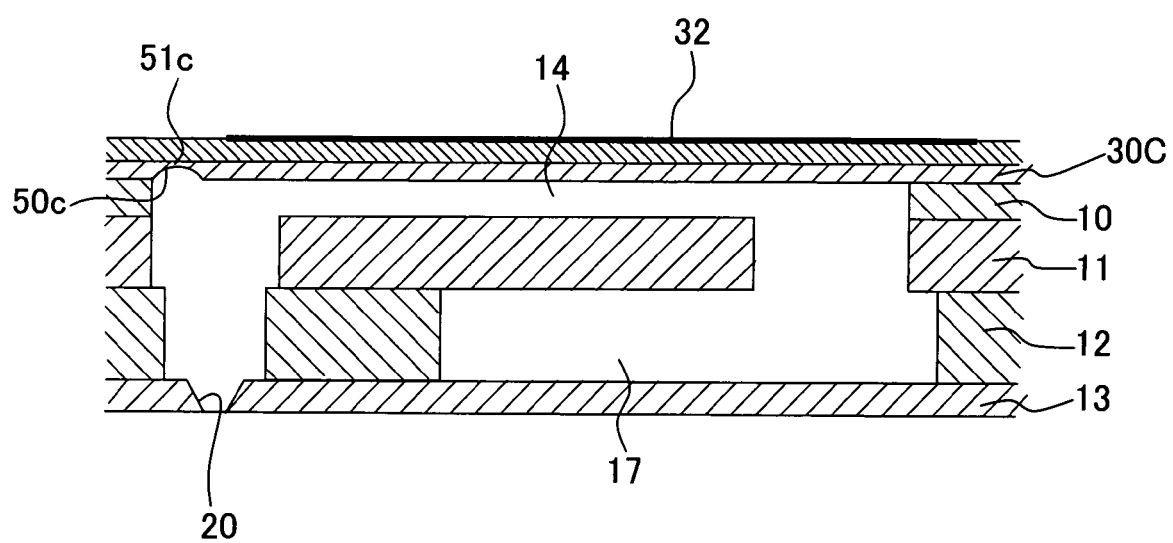
FIG. 10 is a cross-sectional view corresponding to FIG. 4, of an ink-jet head according to a third modified embodiment.

Moreover, as shown in FIG. 10, a thin wall portion 51C may be formed by a recess 50C formed in a lower surface (surface toward the pressure chamber 14) of a vibration plate 30C.

Figure 11:
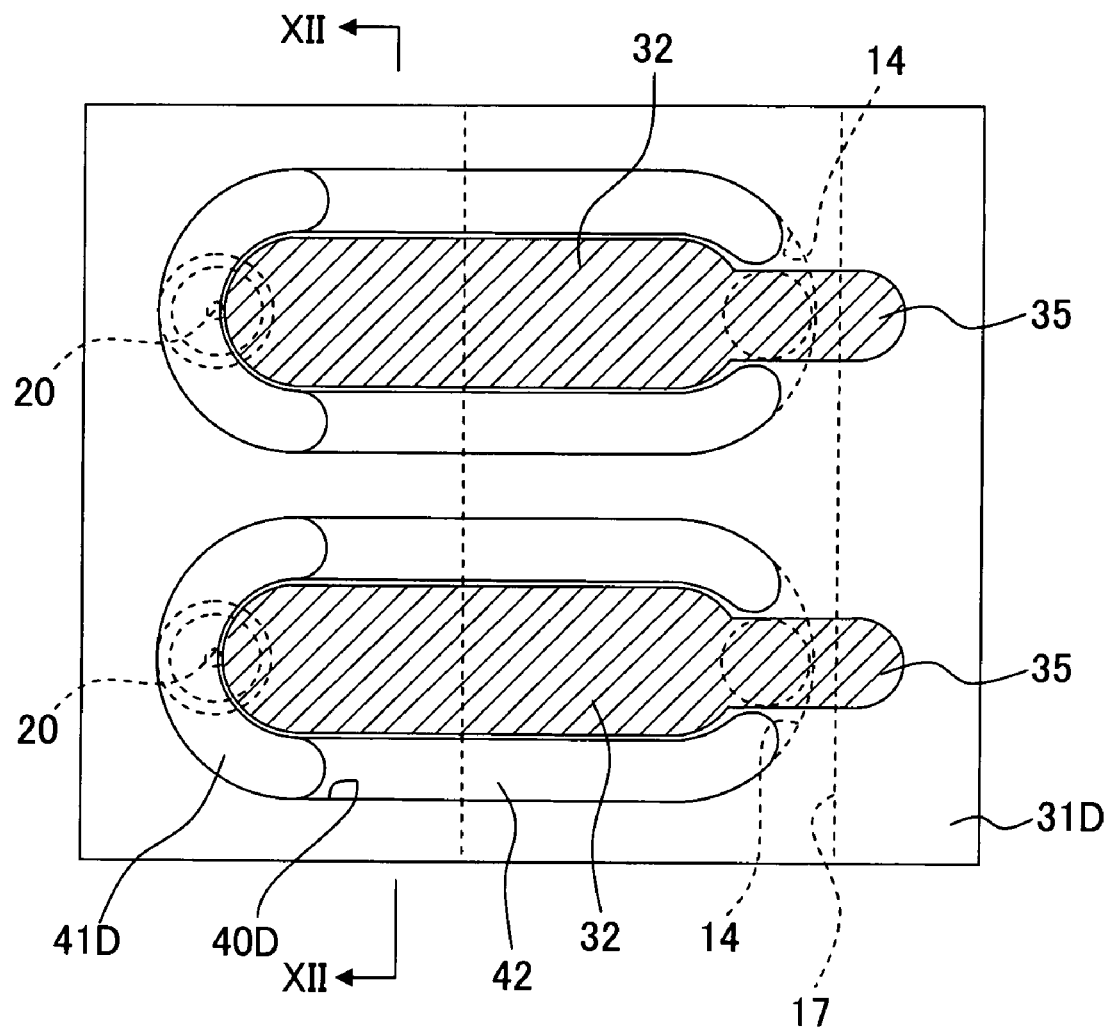
FIG. 11 is a partially enlarged plan view of an ink-jet head according to another example of the third modified embodiment.
Figure 12:
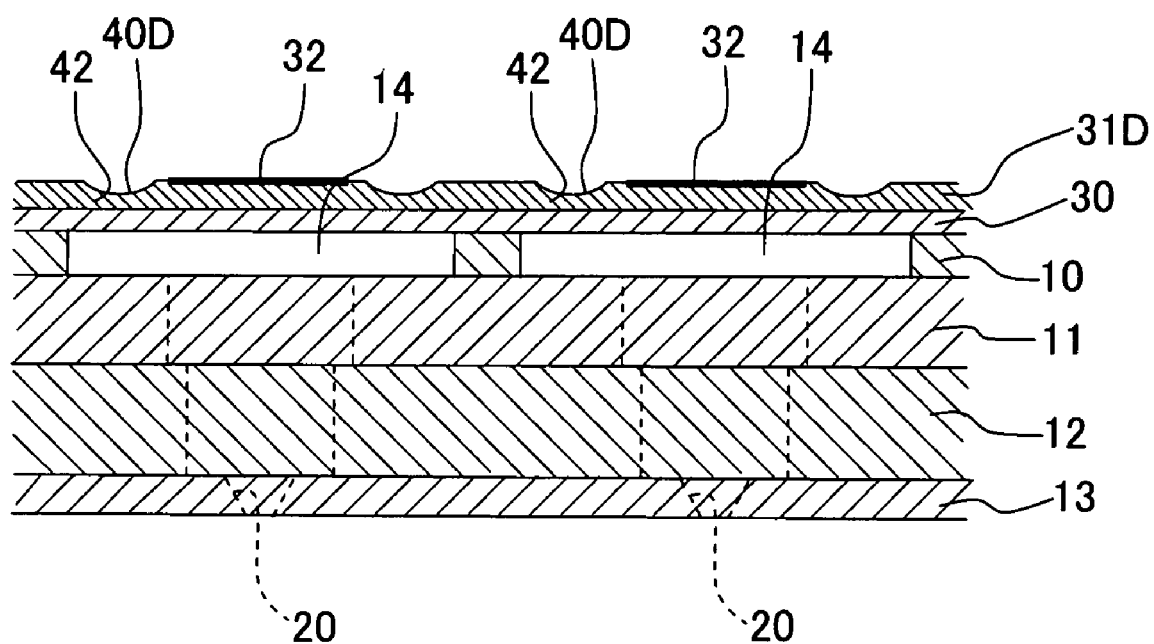
FIG. 12 is a cross-sectional view taken along a line XII-XII in FIG. 11.

As another example, a thin wall portion having a thickness less than a thickness of an area facing a central portion of the pressure chamber may be formed in an area, of the vibration plate or the piezoelectric layer, facing an end portion in the width direction of the pressure chamber. For example, as shown in FIGS. 11 and 12, a recess 40D which is extended in a form of an English alphabet C along a periphery of the pressure chamber 14 may be formed on an upper surface of a piezoelectric layer 31D, in an area overlapping with one end portion in the longitudinal direction of the pressure chamber 14 (end portion toward the nozzle 20), and both end portions in the width direction of the pressure chamber 14. In this case, the portions, of the piezoelectric layer 31D, in which the recess 40D is formed are thin wall portions 41D, 42 having a thickness less than the thickness of the portion facing the central portion of the pressure chamber 14. Here, it is possible to form the portion, of the recess 40D, facing the end portion in the longitudinal direction of the pressure chamber 14, to be deeper than another portion facing the end portion in the width direction of the pressure chamber 14 by changing an intensity and/or a time of irradiation of laser at the time of forming the recess 40D in the piezoelectric layer 31D. Accordingly, it is possible to make the thin wall portion 41D thinner than the thin wall portion 42, the thin wall portion 41D being provided at the end portion in the longitudinal direction of the pressure chamber 14, and the thin wall portion 42 being provided at the end portion in the width direction of the pressure chamber 14. Consequently, the bending stiffness of the piezoelectric layer 31 in the area overlapping with the end portion in the longitudinal direction is lower than the bending stiffness of the piezoelectric layer 31 at the end portion in the width direction. According to this structure, since a displacement of the portion of the vibration plate 30, facing the end portion in the width direction of the pressure chamber 14 is increased (becomes substantial) in addition to a displacement of the portion of the vibration plate 30, facing the end portion in the direction of length of the pressure chamber 14 becoming substantial, the change in the volume of the pressure chamber 14 becomes even more substantial.

Fourth Modification

The bending-stiffness lowering portion which reduces (lowers) partially the bending stiffness of the vibration plate and/or the piezoelectric layer, at a position on the end portion in the longitudinal direction of the pressure chamber may be a plurality of thin wall portions arranged discretely, that is, the bending-stiffness lowering portion may not be restricted to the thin wall portion 41 (refer to FIG. 3) extending continuously along the periphery of the pressure chamber as it has been described above. For example, in FIG. 13, a plurality of recesses (concave portions) 40E dented locally is arranged discretely with a suitable density on an upper surface of a piezoelectric layer 31E, in an area facing one end portion in the longitudinal direction of the pressure chamber 14 (area not facing the individual electrode 32). A plurality of thin wall portions 41E (first thin wall portions) having a thickness less than the thickness of the area facing the central portion of the pressure chamber 14 is formed by these recesses 40E.

Figure 13:
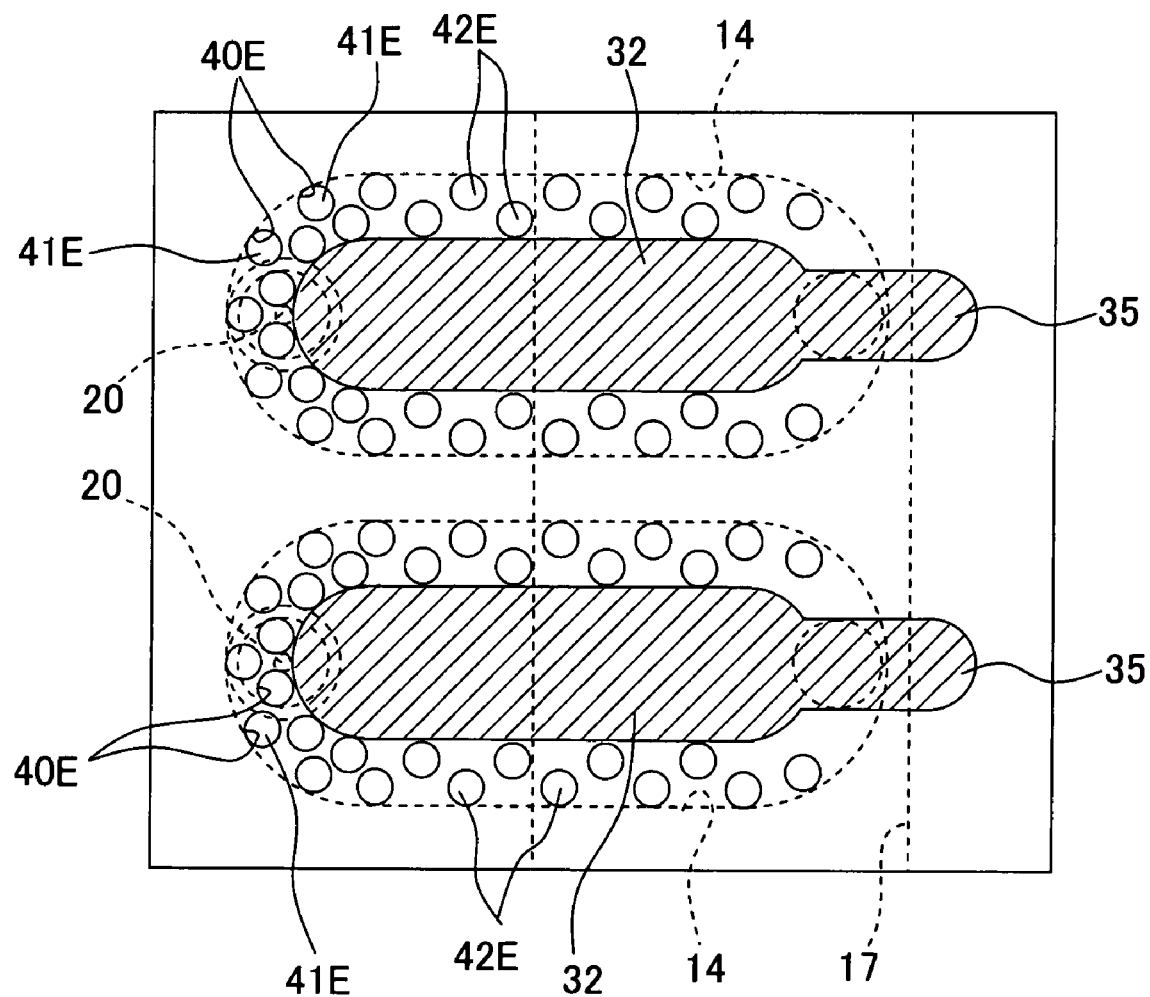
FIG. 13 is a partially enlarged plan view of an ink-jet head according to a fourth modified embodiment.

Furthermore, as shown in FIG. 13, a plurality of recesses 40E may be arranged discretely on the upper surface of the piezoelectric layer 31, in an area facing the end portion in the width direction of the pressure chamber 14, and a plurality of thin wall portions 42E (second thin wall portions) having a thickness less than the thickness of the area facing the central portion of the pressure chamber 14 may be formed by these recesses 40E. In FIG. 13, a density of arrangement of the thin wall portions 41E at the end portion in the longitudinal direction of the pressure chamber 14 is higher than a density of arrangement of the thin wall portions 42E in the width direction of the pressure chamber 14. In other words, an occupancy of the thin wall portions 41E with respect to the area facing one end portion in the longitudinal direction of the pressure chamber 14 is more (higher) than an occupancy of the thin wall portions 42E with respect to the area facing the end portion in the width direction of the pressure chamber 14. As a result, the stiffness of the portion of the piezoelectric layer 31, facing the end portion in the longitudinal direction of the pressure chamber 14 is lower than the stiffness of the piezoelectric layer 31, facing the end portion in the width direction of the pressure chamber 14.

The stiffness of the portion of the piezoelectric layer 31, facing the end portion in the longitudinal direction of the pressure chamber 14 may be reduced to be lower than the stiffness of the portion of the piezoelectric layer 31, facing the end portion in the width direction of the pressure chamber 14 by reducing the thickness of the thin wall portions 41E positioned at the end portion in the longitudinal direction, to be less than the thickness of the thin wall portions 42E positioned at the end portion in the width direction.

Fifth Modification

Figure 14:
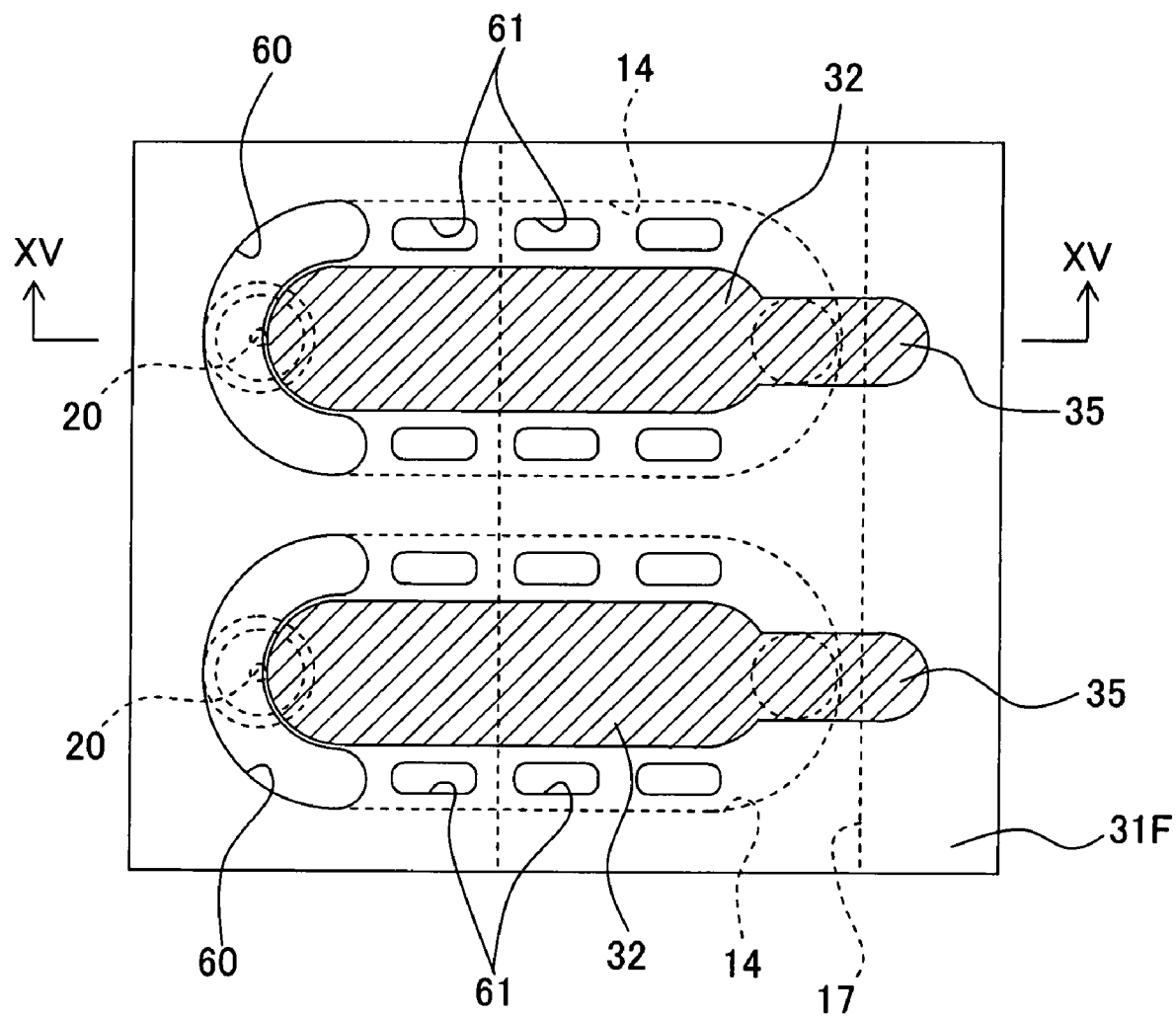
FIG. 14 is a partially enlarged plan view of an ink-jet head according to a fifth modified embodiment.
Figure 15:
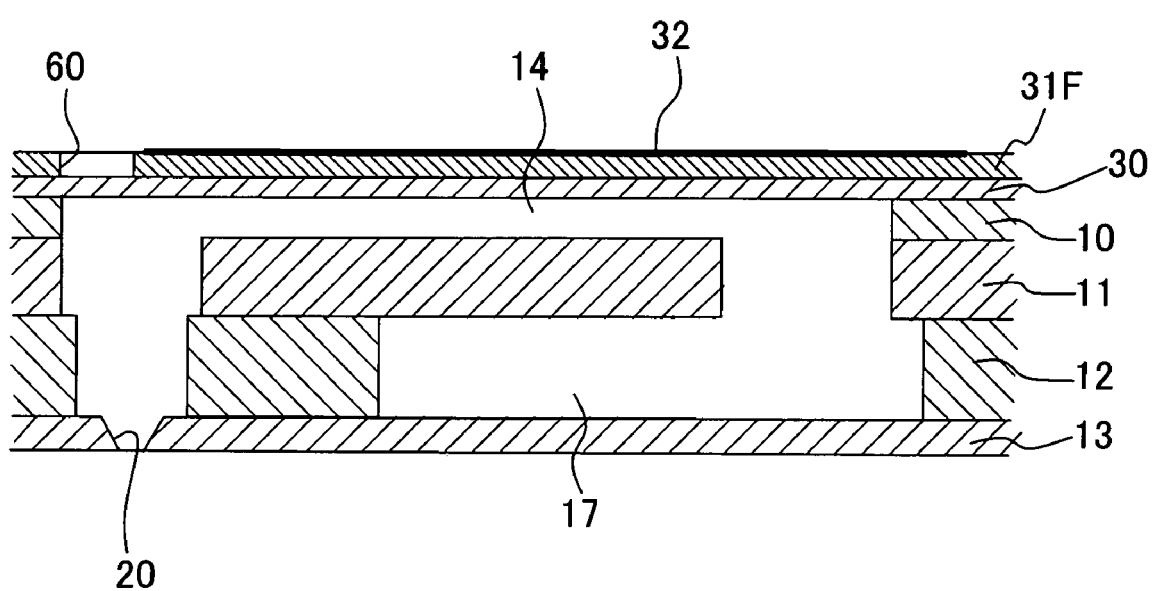
FIG. 15 is a cross-sectional view taken along a line XV-XV in FIG. 14.

Instead of the recess described above, a through hole 60 (first through hole) penetrating a piezoelectric layer 31F may be formed in an area of the piezoelectric layer 31E, facing the end portion in the longitudinal direction of the pressure chamber 14 as a bending-stiffness lowering portion, as shown in FIGS. 14 and 15. Furthermore, a through hole 61 (second through hole) may be formed also in the end portion in the width direction of the pressure chamber 14. In this case, by the following procedure, it is possible to reduce the stiffness of the portion of the piezoelectric layer 31, facing the end portion in the longitudinal direction of the pressure chamber 14, to be further lower than the stiffness of the portion of the piezoelectric layer 31, facing the end portion in the width direction of the piezoelectric layer 31. As shown in FIG. 14, by forming the through hole 60 continuously along the periphery of the pressure chamber 14, and forming the through holes discretely, it is possible to increase an occupancy of the through holes 60 with respect to the area facing one end portion in the longitudinal direction of the pressure chamber to be more than an occupancy of the through holes 61 with respect to the area facing the end portion in the width direction of the pressure chamber 14. Or, the through hole 60 may be formed in the portion facing the end portion in the longitudinal direction of the pressure chamber 14, and a thin wall portion (recess) having a thickness less than the thickness of the portion facing the central portion of the pressure chamber 14 may be formed in the portion facing the end portion in the width direction of the pressure chamber 14.

In the fourth modification (FIG. 13) and the fifth modification (FIG. 14 and FIG. 15), the thin wall portions 41E, 42E, and the through holes 60, 61 are formed in the piezoelectric layer. However, such thin wall portion and/or through hole may be formed in the vibration plate, and the bending stiffness of the vibration plate may be reduced (lowered). In the modifications described above, the thin wall portion and/or through hole which reduce (lower) the bending stiffness of the vibration plate and/or piezoelectric layer may be formed in the vibration plate and/or piezoelectric layer, at both end portions in the longitudinal direction of the pressure chamber, or may be formed only at any one end portion such as an end portion toward the nozzle.

Sixth Modification

Figure 16:
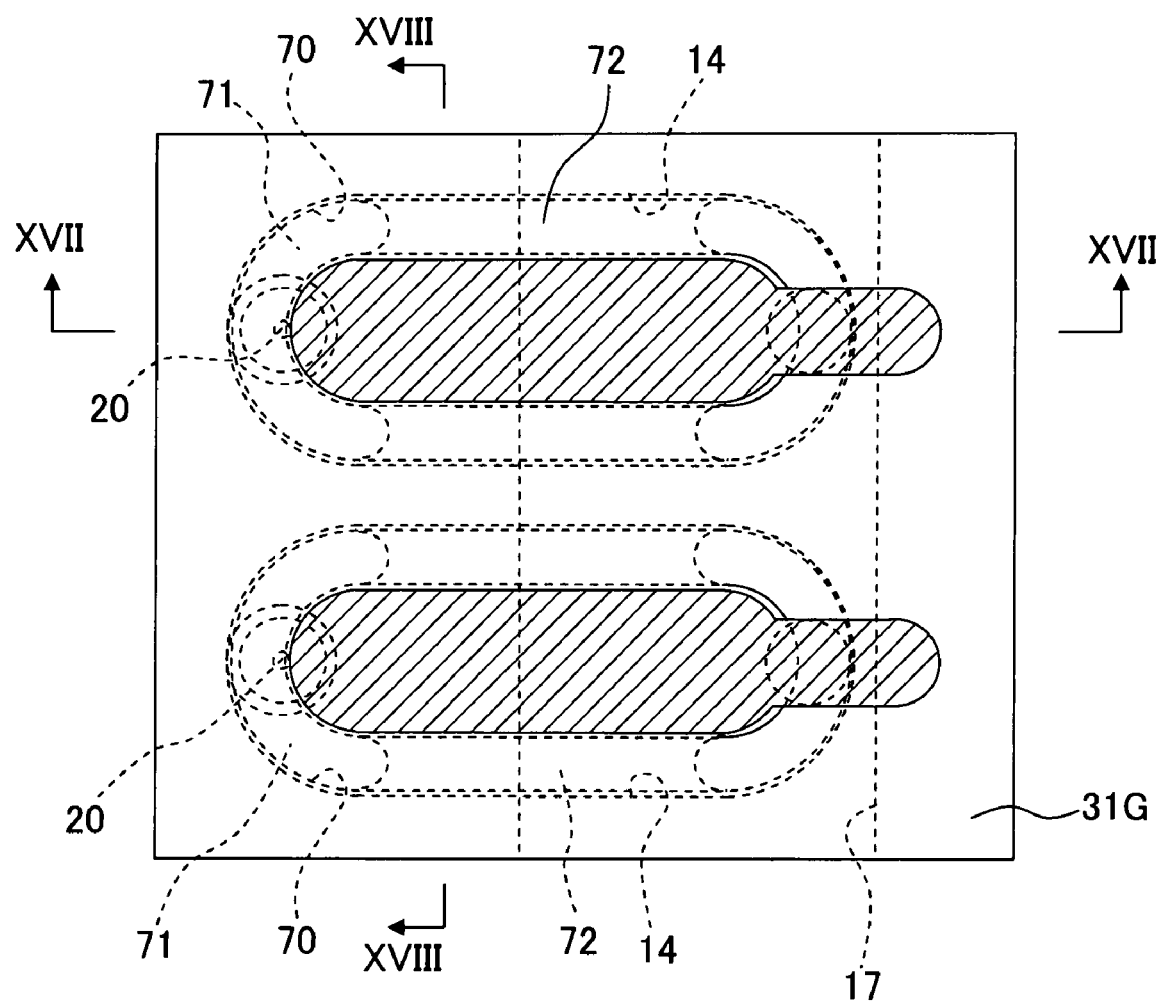
FIG. 16 is a partially enlarged plan view of an ink-jet head according to a sixth modified embodiment.
Figure 17:
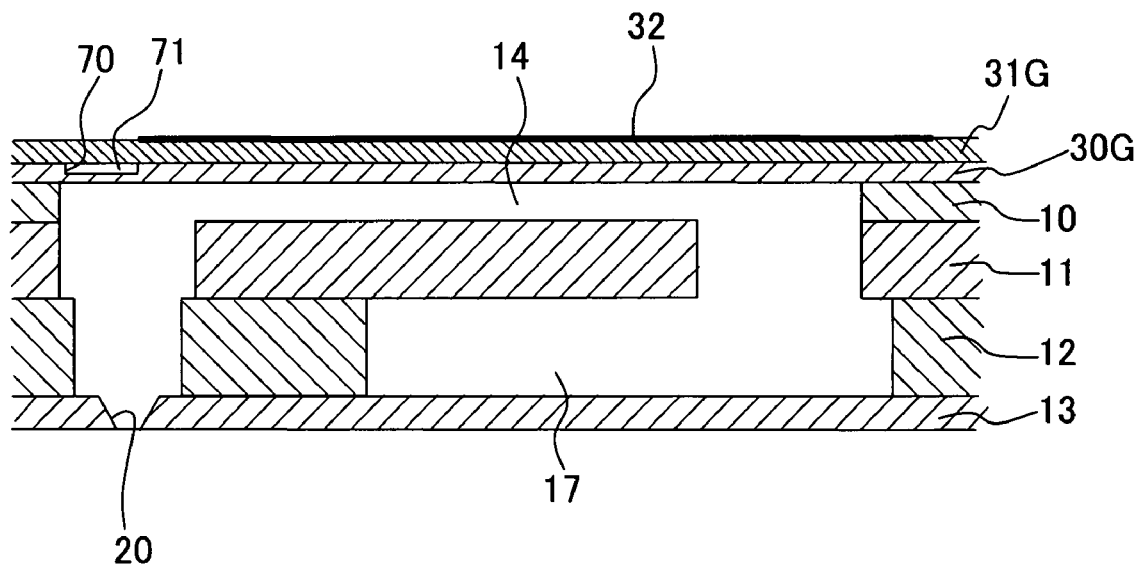
FIG. 17 is a cross-sectional view taken along a line XVII-XVII in FIG. 16.
Figure 18:
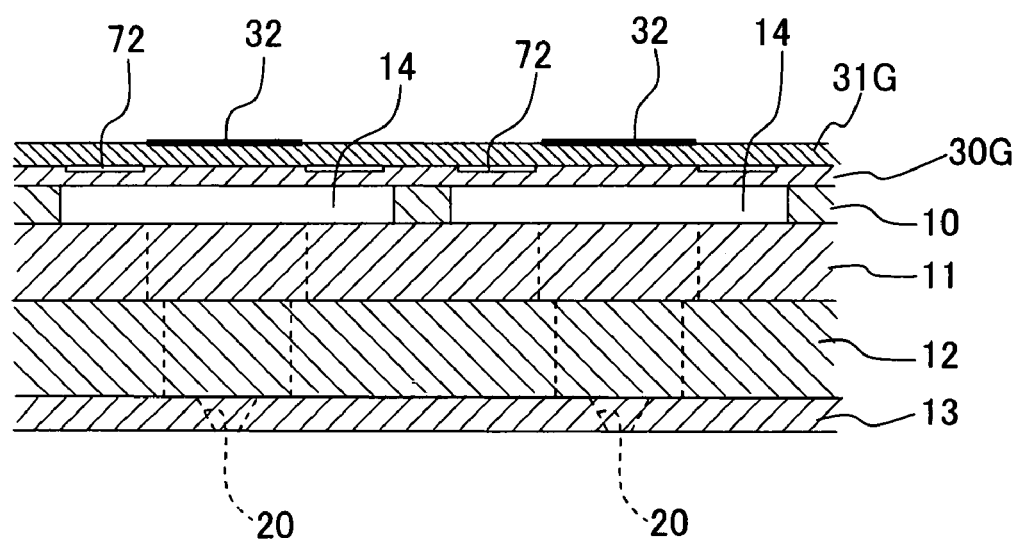
FIG. 18 is a cross-sectional view taken along a line XVIII-XVIII in FIG. 16.

As a bending-stiffness lowering portion, a cavity may be formed in a portion between a vibration plate 30G and piezoelectric layer 31G, facing the end portion in the longitudinal direction of the pressure chamber. For example, as shown in FIGS. 16 to 18, a recess 70 may be formed in the upper surface of the vibration plate 30, and a cavity 71 (first cavity) may be formed between the vibration plate 30G and the piezoelectric layer 31G by avoiding the vibration plate 30G and the piezoelectric layer 31G from closely contacting to the recess 70. In this manner, when the cavity 71 is interposed between the vibration plate 30G and the piezoelectric layer 31G, since the geometrical moment of inertia of a stacked structure (layered structure) made of the vibration plate 30G and the piezoelectric layer 31G becomes small, the bending stiffness is reduced. Furthermore, a cavity 72 (second cavity) may be formed in the area between the vibration plate 30G and the piezoelectric layer 31G, facing the end portion in the width direction of the pressure chamber 14. In this case, the cavity 71 positioned at the end portion in the longitudinal direction may be made to be deeper than the cavity 72 positioned at the end portion in the width direction for reducing further the stiffness of the portion of the piezoelectric layer 31G, facing the end portion in the longitudinal direction of the pressure chamber 14, to be lower than the stiffness of the piezoelectric layer 31G, facing the end portion in the width direction of the pressure chamber 14.

Moreover, a cavity may be formed between the vibration plate 30 and the piezoelectric layer 31 by joining the piezoelectric layer 31, in which a recess is formed in the lower surface thereof, to the upper surface of the flat vibration plate 30. The first cavity mentioned above may be formed in both end portions in the longitudinal direction of the pressure chamber, or may be formed only in one end portion, such as the end portion toward the nozzle.

Figure 19:
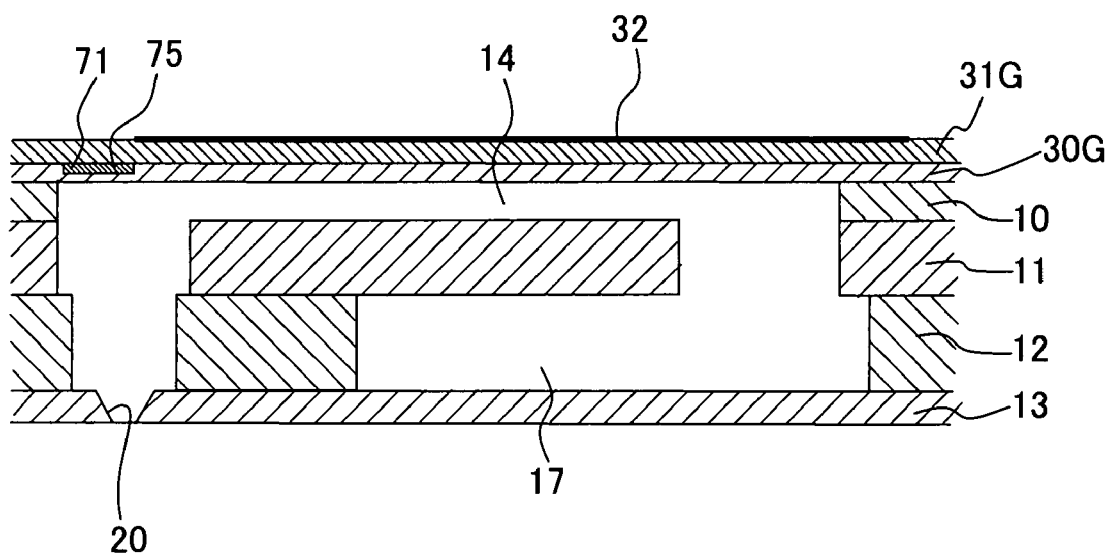
FIG. 19 is a cross-sectional view corresponding to FIG. 4, of an ink-jet head according to another example of the sixth modified embodiment.

As another example, as shown in FIG. 19, a filling material 75 having an elastic coefficient smaller than an elastic coefficient of the vibration plate 30G and the piezoelectric layer 31G may be filled in the cavity 71 formed between the vibration plate 30G and the piezoelectric layer 31G. In this manner, since the filling material 75 having a small elastic coefficient, is interposed between the vibration plate 30G and the piezoelectric layer 31G, the bending stiffness of the stacked structure made of the vibration plate 30G and the piezoelectric layer 31G is reduced. Or, without filling the filling material 75 in the cavity 71 positioned at the end portion in the longitudinal direction of the pressure chamber 14, the filling material 75 may be filled only in the cavity 72 (refer to FIG. 16 and FIG. 18) positioned at the end portion in the width direction of the pressure chamber 14.

Seventh Modification

Figure 20:
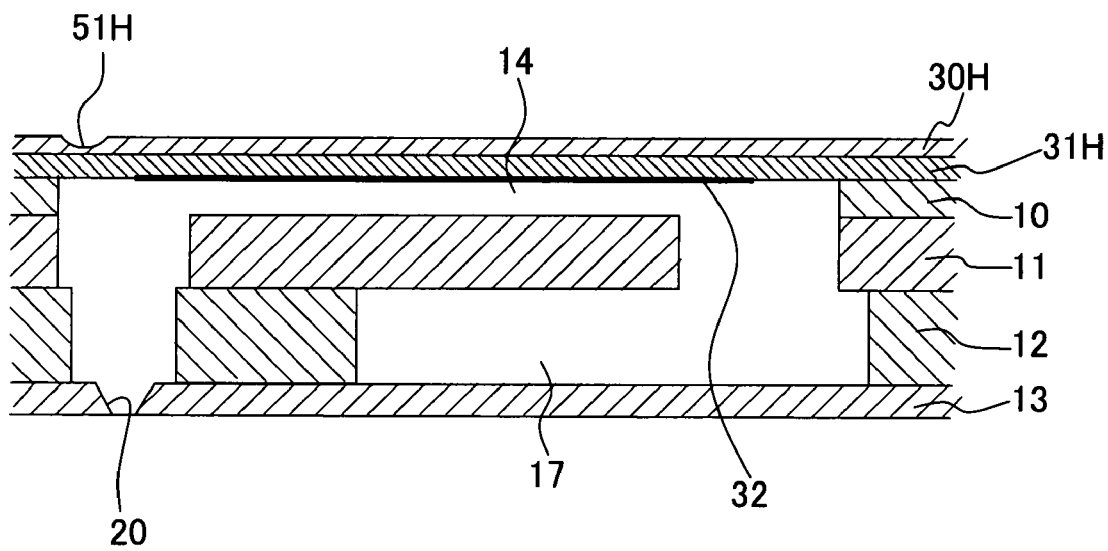
FIG. 20 is a cross-sectional view corresponding to FIG. 4, of an ink-jet head according to a seventh modified embodiment.

In the embodiment and the modifications described above, the vibration plate is joined to the cavity plate (supporting member) in which the pressure chambers are formed. However, as shown in FIG. 20, a piezoelectric layer 31H may be joined to the upper surface of the cavity plate 10, and a vibration plate 30H may be provided on an upper surface of the piezoelectric layer 31H. Even in this case, since a bending-stiffness lowering portion (in FIG. 20, thin wall portion 51H formed in the vibration plate 30H) is provided in the portion of the piezoelectric layer 31H and/or the vibration plate 30H, facing the end portion in the longitudinal direction of the pressure chamber 14, it is possible to increase the displacement of the vibration plate 30H and the piezoelectric layer 31H, in the area facing the end portion in the longitudinal direction of the pressure chamber 14.

Eighth Modified Embodiment

In the embodiment and the modifications described above, the bending-stiffness lowering portion, such as a thin wall portion, which reduces the bending stiffness of the portion facing the end portion in the longitudinal direction of the pressure chamber 14, is provided on the vibration plate or the piezoelectric layer of the piezoelectric actuator. In addition to this, or instead of this, even when the bending-stiffness lowering portion which reduces the bending stiffness of a side-wall portion is provided on a side wall portion defining the pressure chamber, of a partition wall to be joined to the vibration plate (or the piezoelectric layer), at the side-wall portion joined with the pressure chamber, almost similar effect can be achieved.

Figure 21:
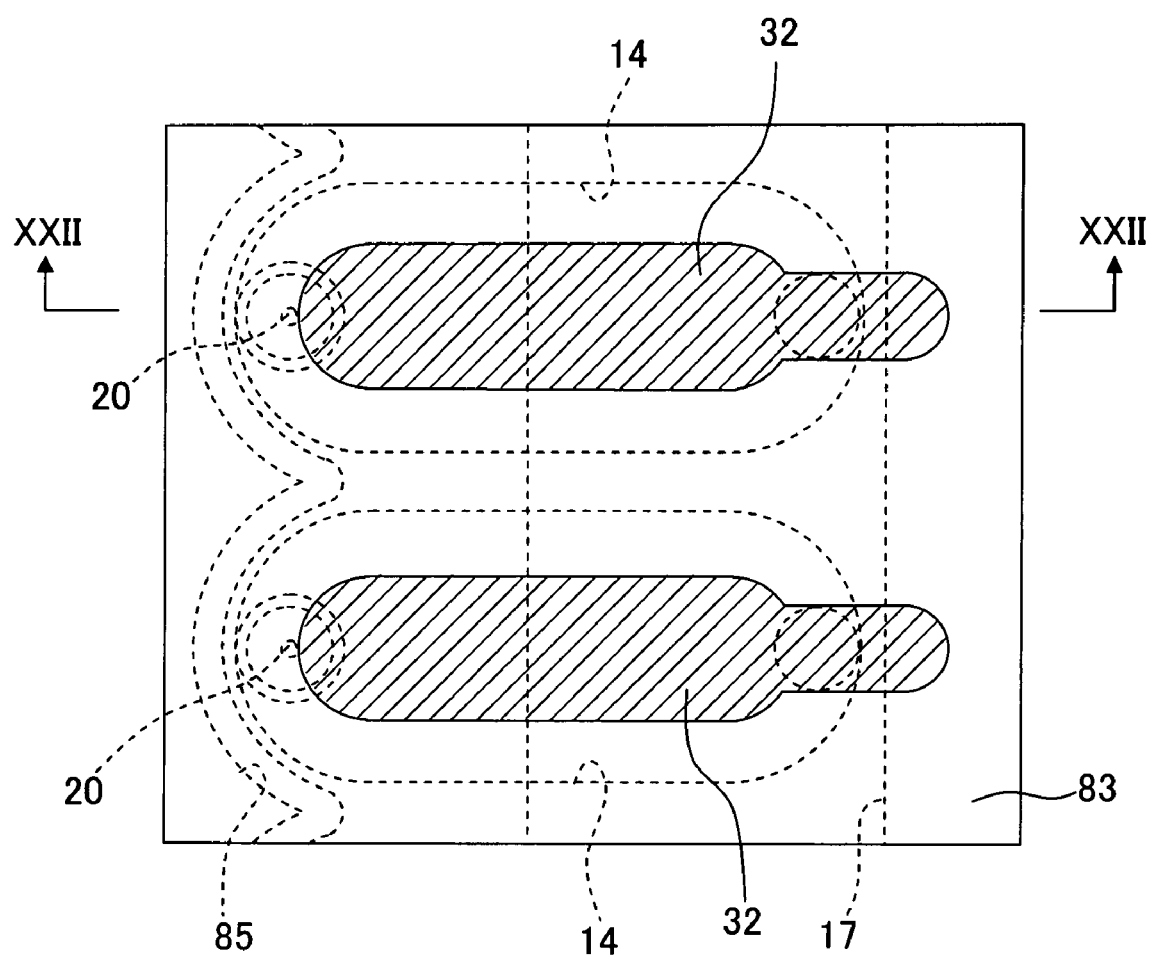
FIG. 21 is a partially enlarged plan view of an ink-jet head according to an eighth modified embodiment.
Figure 22:
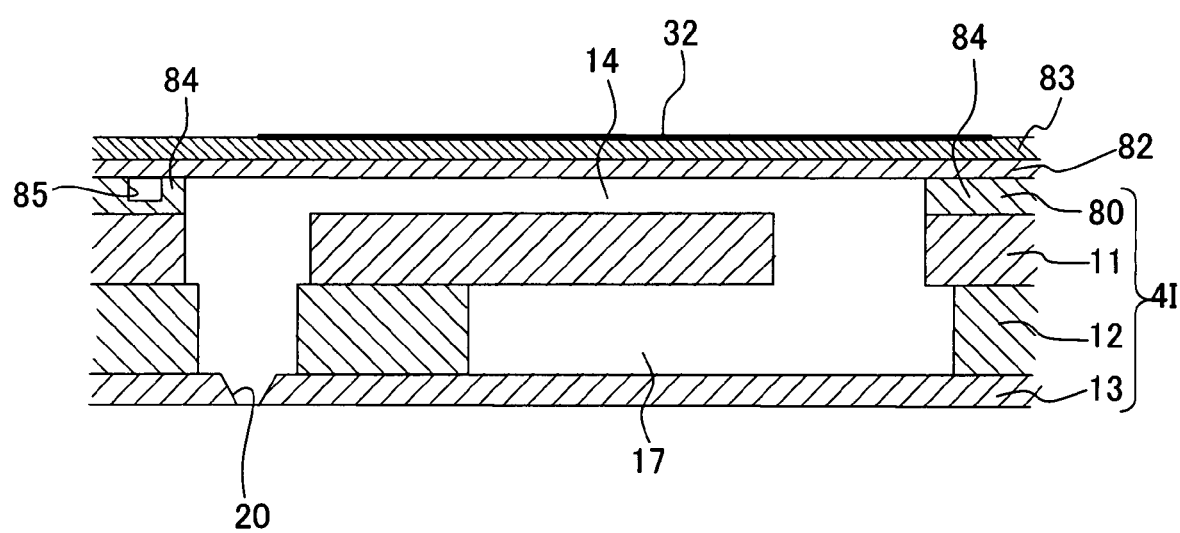
FIG. 22 is a cross-sectional view taken along a line XXII-XXII in FIG. 21.

For example, as shown in FIGS. 21 and 22, in a partition wall 84, which divides the pressure chambers 14, of a cavity plate 80 which forms a channel unit 4I, a groove 85 may be formed along a periphery of one end portion (end portion toward the nozzle 20) in the longitudinal direction of the pressure chamber 14 as the bending-stiffness lowering portion. In this manner, by providing the groove 85 in the partition wall 84, the bending stiffness of the side-wall portion of the partition wall 84 in contact with the pressure chamber 14 is reduced. A force of constraint of the side-wall portion, with respect to the portion of a vibration plate 82 and a piezoelectric layer 83, facing the end portion in the longitudinal direction of the pressure chamber 14 is reduced, and a displacement in this portion becomes substantial.

Figure 23:
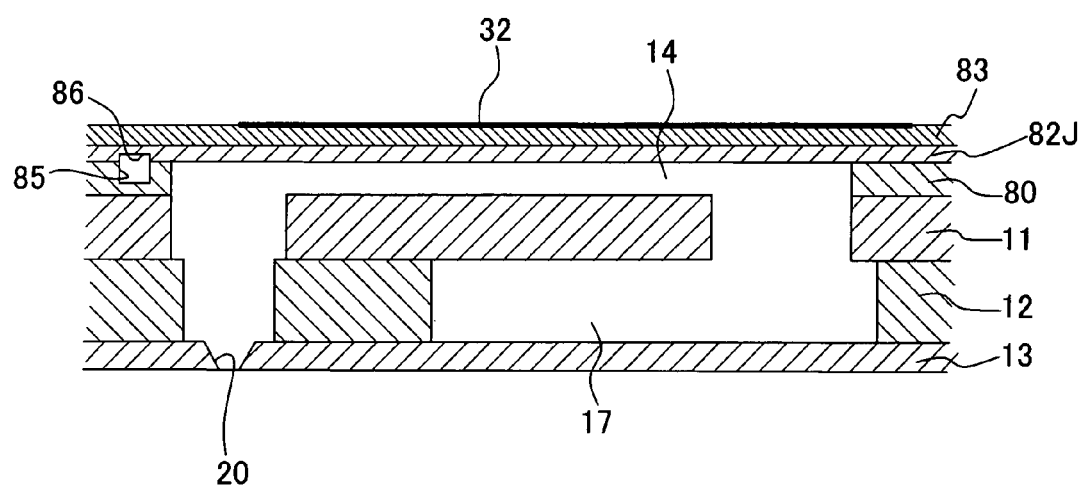
FIG. 23 is a cross-sectional view corresponding to FIG. 4, of an ink-jet head according to a second example of the eighth modified embodiment.
Figure 24:
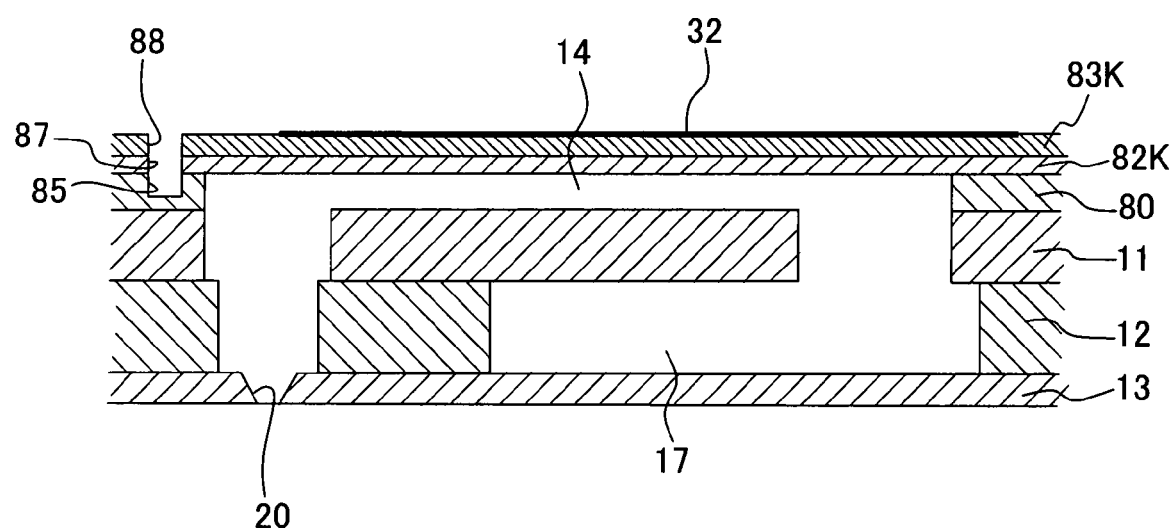
FIG. 24 is a cross-sectional view corresponding to FIG. 4, of an ink-jet head according to a third example of the eighth modified embodiment.

Moreover, as shown in FIG. 23, a groove 86 may be formed to face the groove 85 in the cavity plate 80, in a lower surface of a vibration plate 82J. Or, as shown in FIG. 24, through holes 87, 88 which communicate with the groove 85 in the cavity plate 80 may be formed in a vibration plate 82K and a piezoelectric layer 83K.

In the embodiment and the modifications described above, the vibration plate also serves as the second electrode generating the electric field in the piezoelectric layer. However, the vibration plate and the second electrode may be provided independently. For example, the second electrode may be formed on an upper surface of a vibration plate made of an insulating material such as alumina and zirconia. Or, when the upper surface of the vibration plate is electroconductive due to the vibration plate being formed by a metallic material similarly as in the embodiment, an insulating film may be formed between the upper surface of the vibration plate and the second electrode.

The shape of the pressure chamber in a plan view is not restricted to the elliptical shape, and the present invention is applicable provided that the shape of the pressure chamber is a long shape in one direction, and the pressure chamber may have a shape of a rectangle or a parallelogram. Moreover, various bending-stiffness lowering portions described in the embodiment and the modified embodiments mentioned above, may be combined. For example, with a recess formed in the vibration plate and/or the piezoelectric layer, at both end portions in the longitudinal direction of the pressure chamber, a groove may be formed in a partition wall in contact with the pressure chamber, at both end portions in the longitudinal direction of the pressure chamber.

Examples in which the present invention is applied to the piezoelectric actuator for the ink-jet head have been described. However, the application of the present invention is not limited to an actuator which applies a pressure to a liquid such as ink. In other words, the present invention is also applicable to piezoelectric actuators used for other applications, such as an actuator which drives by pushing various objects by a deformed portion of the vibration plate and the piezoelectric layer, while releasing a deformation of the vibration plate and the piezoelectric layer by an relief portion of a supporting member.

What is claimed is:

1. A piezoelectric actuator which applies a pressure to an object, comprising:
    a vibration plate;
    a piezoelectric layer arranged on one surface of the vibration plate;
    a supporting member supporting the vibration plate and the piezoelectric layer, the supporting member having a relief portion which is long in a predetermined longitudinal direction and which releases a deformation of the vibration plate and the piezoelectric layer, and a joining portion which is arranged to surround the relief portion and is joined to one of the vibration plate and the piezoelectric layer; and
    a first electrode and a second electrode which are arranged on both surfaces of the piezoelectric layer respectively, each of the first and second electrodes being arranged at an area facing the relief portion;
    wherein a bending-stiffness lowering portion is formed in one of the vibration plate and the piezoelectric layer at a first area facing one end of the relief portion in the longitudinal direction; and
    wherein a first bending stiffness of the bending-stiffness lowering portion is lower than a second bending-stiffness of an other portion of the one of the vibration plate and the piezoelectric layer in which bending-stiffness lowering portion is formed, at a second area facing one end of the relief portion in a width direction orthogonal to the longitudinal direction.

2. The piezoelectric actuator according to claim 1,
wherein the bending-stiffness lowering portion includes a first bending-stiffness lowering portion and a second bending-stiffness lowering portion; and
wherein the first bending-stiffness lowering portion and the second bending-stiffness lowering portion are provided, on one of the vibration plate and the piezoelectric layer, at the first area facing the one end in the longitudinal direction and a third area facing the other end in the longitudinal direction of the relief portion, respectively.

3. The piezoelectric actuator according to claim 1,
wherein the bending-stiffness lowering portion is a first thin wall portion having a wall thickness smaller than a thickness of a fourth area, of one of the vibration plate and the piezoelectric layer, facing a central portion of the relief portion.

4. The piezoelectric actuator according to claim 3,
wherein the first thin wall portion is a recess formed locally on a surface, of the piezoelectric layer, on a side opposite to the vibration plate, the recess being formed at another area of the piezoelectric layer facing the one end in the longitudinal direction of the relief portion; and
wherein the piezoelectric actuator further includes a predetermined wiring portion which is connected to one of the first electrode and the second electrode arranged on a surface, among the both surfaces of the piezoelectric layer, on a side opposite to the vibration plate, the wiring portion being arranged avoiding the first thin wall portion.

5. The piezoelectric actuator according to claim 3,
wherein a second thin wall portion having a wall thickness smaller than a thickness of the fourth area of one of the vibration plate and the piezoelectric layer is formed on the second area of one of the vibration plate and the piezoelectric layer.

6. The piezoelectric actuator according to claim 5,
wherein the first thin wall portion is thinner than the second thin wall portion.

7. The piezoelectric actuator according to claim 5,
wherein a ratio of an area of the first thin wall portion with respect to the first area of one of the vibration plate and the piezoelectric layer is greater than a ratio of an area of the second thin wall portion with respect to the second area of one of the vibration plate and the piezoelectric layer.

8. The piezoelectric actuator according to claim 1,
wherein the bending-stiffness lowering portion is a first through hole formed in the first area of one of the vibration plate and the piezoelectric layer.

9. The piezoelectric actuator according to claim 8,
wherein a second through hole is formed in the second area of one of the vibration plate and the piezoelectric layer; and
wherein a ratio of an opening area of the first through hole with respect to the first area of one of the vibration plate and the piezoelectric layer is greater than a ratio of an opening area of the second through hole with respect to the second area of one of the vibration plate and the piezoelectric layer.

10. The piezoelectric actuator according to claim 8, wherein a thin wall portion, of which thickness is smaller than a thickness of the vibration plate and the piezoelectric layer in the fourth area, is formed in the second area of one of the vibration plate and the piezoelectric layer.

11. The piezoelectric actuator according to claim 1, wherein the bending-stiffness lowering portion is a first cavity formed in a portion between the vibration plate and the piezoelectric layer, the portion facing the one end in the longitudinal direction of the relief portion.

12. The piezoelectric actuator according to claim 11, wherein a second cavity is formed in another portion between the vibration plate and the piezoelectric layer, the another portion facing the one end in the width direction of the relief portion; and
wherein a depth of the first cavity is greater than a depth of the second cavity.

13. The piezoelectric actuator according to claim 11, wherein a filling material having an elastic coefficient smaller than an elastic coefficient of each of the vibration plate and the piezoelectric layer is filled in the first cavity.

14. The piezoelectric actuator according to claim 1, wherein the bending-stiffness lowering portion is formed only at the first area of at least one of the vibration plate and the piezoelectric layer.

15. A piezoelectric actuator which applies a pressure to an object, comprising:
a vibration plate;
a piezoelectric layer arranged on one surface of the vibration plate;
a supporting member which supports the vibration plate and the piezoelectric layer, the supporting member having a relief portion which is long in a predetermined longitudinal direction and which releases a deformation of the vibration plate and the piezoelectric layer, and a joining portion which is arranged to surround the relief portion and which has a wall facing one end of the relief portion in the longitudinal direction; and
a first electrode and a second electrode which are arranged on both surfaces of the piezoelectric layer respectively, each of the first and second electrodes being arranged at an area facing the relief portion;
wherein a bending-stiffness lowering portion, which lowers a bending stiffness of the wall, is formed in the wall of the joining portion.

16. The piezoelectric actuator according to claim 15, wherein the bending-stiffness lowering portion is a groove formed in the wall along the one end in the longitudinal direction of the relief portion.

17. The piezoelectric actuator according to claim 15, wherein the bending-stiffness lowering portion is formed only in a portion, of the wall, facing the one end in the longitudinal direction of the relief portion.

18. A liquid transporting apparatus which transports a liquid, comprising:
the piezoelectric actuator as defined in claim 1; and
a channel unit in which a liquid channel is formed, and which is joined to the supporting member to form a pressure chamber, as the relief portion, in the liquid channel;
wherein the vibration plate covers the pressure chamber, and the piezoelectric actuator applies a pressure to the liquid in the pressure chamber.

19. The liquid transporting apparatus according to claim 18, wherein the bending-stiffness lowering portion is formed only in the first area, of at least one of the vibration plate and the piezoelectric layer, facing the one end in the longitudinal direction of the pressure chamber.

20. A liquid-droplet jetting apparatus which jets a droplet of a liquid, comprising:
the piezoelectric actuator as defined in claim 1; and
a channel unit in which a nozzle and a liquid channel is formed, and which is joined to the supporting member to form a pressure chamber, as the relief portion, in the liquid channel, the pressure chamber communicating with the nozzle;
wherein the vibration plate covers the pressure chamber, and the piezoelectric actuator applies a pressure to the liquid in the pressure chamber.

21. The liquid-droplet jetting apparatus according to claim 20, wherein the one end in the longitudinal direction of the pressure chamber communicates with the nozzle.

22. The liquid-droplet jetting apparatus according to claim 20, wherein the bending-stiffness lowering portion is formed only at the one end, of at least one of the vibration plate and the piezoelectric layer, in the longitudinal direction of the pressure chamber, the one end being on a side of the nozzle.

23. A liquid-droplet jetting apparatus which jets a droplet of a liquid, comprising:
the piezoelectric actuator as defined in claim 15; and
a channel unit in which a nozzle and a liquid channel are formed, and which is joined to the supporting member to form a pressure chamber, as the relief portion, in the liquid channel, the pressure chamber communicating with the nozzle;
wherein the vibration plate covers the pressure chamber, and the piezoelectric actuator applies a pressure to the liquid in the pressure chamber.

24. The liquid-droplet jetting apparatus according to claim 23, wherein one end in the longitudinal direction of the pressure chamber communicates with the nozzle.

25. The liquid-droplet jetting apparatus according to claim 23, wherein the bending-stiffness lowering portion is formed only at one end, of the one of the vibration plate and the piezoelectric layer, in the longitudinal direction of the pressure chamber, the one end being on a side of the nozzle.

* * * * *